United States Patent [19]
Evseev et al.

[11] Patent Number: 5,468,976
[45] Date of Patent: Nov. 21, 1995

[54] SEMI CONDUCTOR RECTIFYING MODULE

[76] Inventors: Yury Evseev, Ul.Bratskaya 19, k.1,kv,90, Moscow, Russian Federation; Lubomir Rachinsky, ul. Zvenigorodskaya 8 kv 104; Natalia Tetervova, Ul.Reliefnaya 4 kv 22, both of Zaporozhie, Ukraine; Kazimir Seleninov, ul Lianemere 37 kv 18, Tallinn, Estonia; Evgeniy Dermenzhi, ul.Sadovi Proezd 1 ky 49, Reytov, U.S.S.R.; Olga Nasekan, Ul.Rustavi 3 kv 42, Saporozhie, Ukraine; Eva Druyanova, ul Vintera 34 kv 2, Saporozhie, Ukraine; Roman Ribak, Pr. Lenina 190 kv 26, Saporozhie, Ukraine

[21] Appl. No.: 288,226

[22] Filed: Aug. 9, 1994

[30] Foreign Application Priority Data

Aug. 27, 1993 [SU] U.S.S.R. .................. 93042893
Aug. 27, 1993 [SU] U.S.S.R. .................. 93042905
Aug. 27, 1993 [SU] U.S.S.R. .................. 93042907
Aug. 27, 1993 [SU] U.S.S.R. .................. 93042908

[51] Int. Cl.$^6$ .......................... H01L 29/06; H01L 23/16; H01L 39/02
[52] U.S. Cl. ............. 257/177; 257/104; 257/113; 257/116; 257/653; 257/725
[58] Field of Search ................. 257/115, 116, 257/717, 113, 114, 510, 170, 177, 724, 725, 104, 653

[56] References Cited

U.S. PATENT DOCUMENTS

| | | | |
|---|---|---|---|
| 3,699,402 | 10/1972 | McCann et al. | 257/717 |
| 4,016,593 | 4/1977 | Konishi et al. | 257/116 |

FOREIGN PATENT DOCUMENTS

| | | | |
|---|---|---|---|
| 53-126877 | 11/1978 | Japan | 257/113 |
| 58-31571 | 2/1983 | Japan | 257/115 |

*Primary Examiner*—Jerome Jackson
*Assistant Examiner*—Donald L. Monin
*Attorney, Agent, or Firm*—Ilya Zborovsky

[57] ABSTRACT

A semiconductor rectifying module has a metal base, a dielectric heat conducting spacer arranged on the metal base and rectifying elements of anode and cathode groups arranged with their cathodes and anodes on the spacer, the rectifying elements being composed of a semiconductor with at least two layers having alternating conductivity types, each of the rectifying elements being surrounded by its side surface by a side layer of a first type conductivity semiconductor material while an original material is a second type conductivity semiconductor material, and being provided with an upper closed separating groove with an external part bordering at least the side layer.

40 Claims, 25 Drawing Sheets

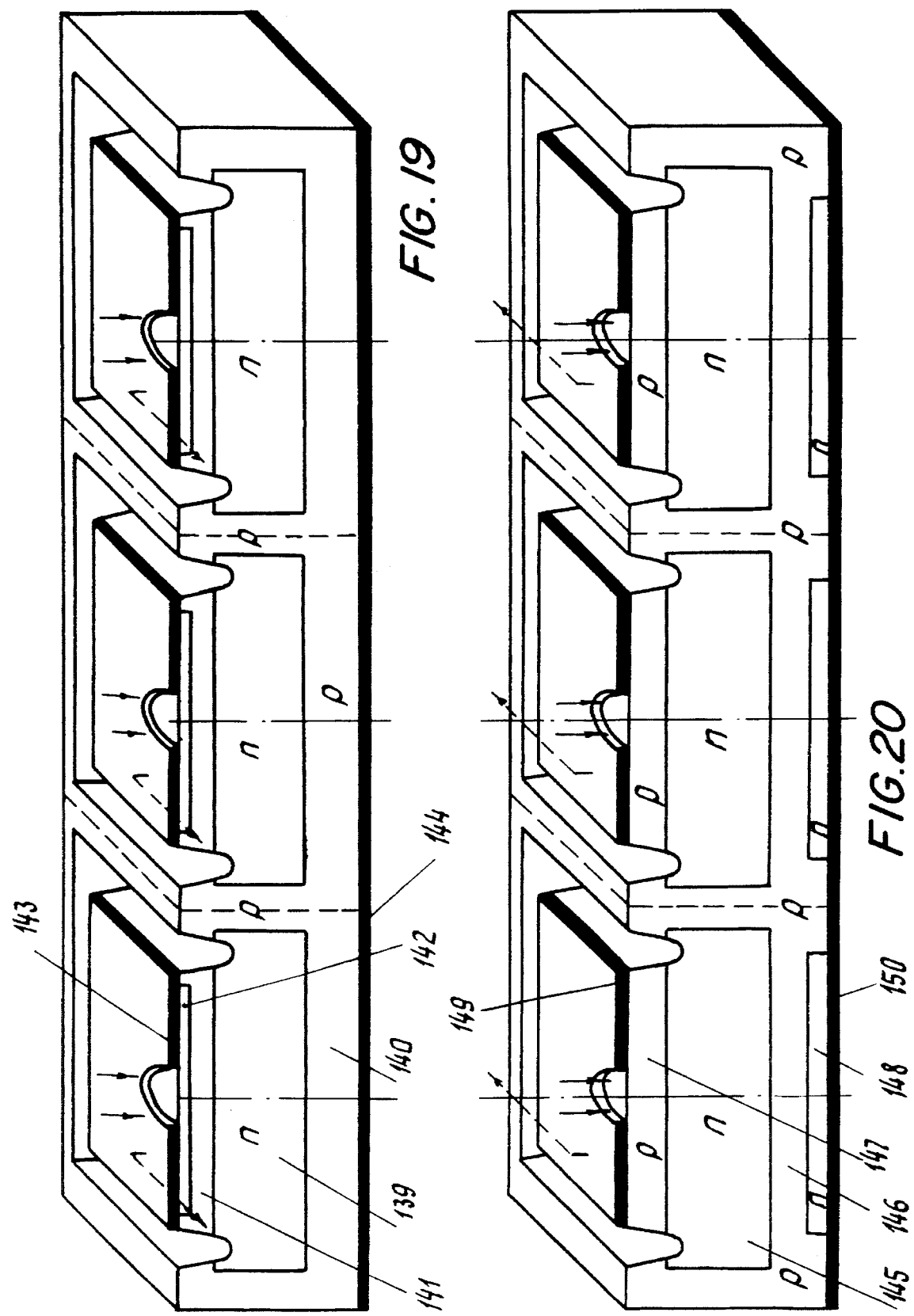

SEMI CONDUCTOR RECTIFYING MODULE

BACKGROUND OF THE INVENTION

The present invention relates to a semiconductor rectifying module.

In order to rectify alternating current, presently diode or thyristor hybrid or integral rectifying bridges are used. In general, as disclosed for example in U.S. Pat. No. 3,654,527, a diode rectifying bridge is a metal base operating as a heat removal, on which two metal plates are mounted as current leads by means of a spacer of dielectric heat conducting material, which as a rule is ceramic or organosilicon compound. At least one diode is mounted on every metal plate, and the diode connection of different plates is made antiparallel. The isolation of diode elements both for separate and group versions (hybrid or integral) is performed by means of grooves on upper and lower surfaces hampering the rectifying module mounting. In this case the optimal configuration of the grooves with respect to the breakthrough voltage is not determined. In case of hybrid version, the isolation between separate elements is performed by air gaps resulting in essential increase of the module size as well as in decrease of mechanical strength.

In the case of anode bridges, there are no group diodes mounted with the cathodes on one plate, and cathode group diodes with their anodes on the other plate, and their contact surfaces are located in one plane. In the case of thyristor controlled modules as disclosed for example in European patent application 0015053 or U.S. Pat. No. 4,313,128, since control areas are located on the cathode side, the thyristor element anode surfaces are directed to the plates. Since the rectified current has to be supplied to the cathode of one thyristor group and to the anode of the other thyristor group, in the above described method of mounting of thyristor elements the supply of the current to be rectified and the output of the rectified current to the thyristors of the anode group is complicated and requires special constructions of current leads and collectors which results in a more complicated constructions, its lower reliability, its higher mass and size. The isolation of separate thyristor elements is usually performed by means of air gaps, which increases the dimensions and reduces reliability since conductive agents, such as water can penetrate between the elements.

As for mass and dimensions, thyristor modules are desirable with anode group thyristors mounted with the cathodes on a common plate and cathode group thyristors with anodes mounted on a common plate, as for example in a diode rectifying bridge disclosed in U.S. Pat. No. 3,654,527. In this case a version of the Japanese patent application 63-61786 can be utilized. However, for an anode group it is necessary to use thyristor elements mounted with their cathodes at the base. In this case there is a problem for the thyristor element to be controlled and for the p-n junction to be reliably isolated. One way to solve this problem is to provide the thyristor controlled from the anode side with a region of the electron type as a gate, as disclosed in British Patent 1,185,667. The presence of the fifth layer leads to uncontrolled turning on during the commutation which is the effect similar to the $dv/dt_{com}$ effect in triacs. Another version is a reverse p-n-p-n structure with the gate located in the bottom plane, which however complicates assembling and lowering the switching voltage since the reverse p-n-p-n structure does not allow creating a needed strength factor on the surface due to the special protection coat thickenings. This problem cannot be solved by means of p-n-p-n structure with the groove and an isolating p-layer as disclosed in the Japanese patent application 63-61786. Here, as well as in the case of U.S. Pat. No. 4,131,128 the groove optimal configuration with respect to the breakthrough voltage is not determined.

As for the reverse rectifying bridges they have to use bidirectional thyristors such as triacs or symistors as disclosed in British Patent 1,186,667. However, these devices have different current values for forward and reverse polarities and the reverse control current can essentially exceed the control current of a conventional thyristor. For using in rectifying circuits, optothyristor pairs are desirable, with a photothyristor as a photodetector and a semiconductor light emitting diode as a light source. In this case an electrical decoupling (isolation) between the control circuit and the main circuit is obtained. There are many solutions with the use of photothyristors controlled from the cathode side, as disclosed for example in German Patent 2,951,916. There is no information about a second group of photothyristors controlled from the anode side, and it is believed that the reason is that the anode side control requires more power.

As for reverse rectifiers with an isolated input, optosymistors with optrons as rectifying elements should be used. In this case a photosymistor which is a bidirectional switch is used as a photodetector controlled by light from one plane side, as disclosed in the publication Y.A. Evseev, A.N. Dumanevitch "The New Types of Symmetrical Thyristors", World Electrotechnical Congress Reports, Section 5A, Report 42, Moscow, 1977. A semiconductor light emitting diode is used as a light source. The problem of low control power with maintaining dynamic characteristics is even more complicated for photosymistors as compared with photothyristors.

SUMMARY OF THE INVENTION

Accordingly, it is an object of the present invention to provide a small-size semiconductor rectifying module suitable for operation with high currents and voltages and a method of producing the same.

In keeping with these objects and with others which will become apparent hereinafter, one feature of the present invention resides, briefly stated, in a semiconductor rectifying module in which every rectifying element is surrounded over its side surface by a layer of a first type conductivity semiconductor material (side layer). This layer of the first type conductivity material is separated from a second type conductivity material by a closed separating groove crossing the base p-n junction. The groove is formed on the upper side with respect to the plane base. This solution makes possible to locate the elements of anode and cathode groups on a common isolating base with contacts to common points of the anode and cathode groups made as metal strips. The upper contacts are arranged in pairs in only one cathode and one anode element. A diode, thyristor, symistor (triac) optothyristor and optosymistor can be used as a rectifying element.

In case of the diode, the groove external part is located at the boundary of the side hole layer, for example, and the original material. The groove can be shifted from the periphery but in this case the effective surface of the device is reduced. The diode elements can be mounted as separate (hybrid) elements in form of two monocrystal blocks for anode and cathode groups isolated by an air gap or in form of an integral circuit. In the latter case, the anode and cathode groups are united in a single crystal with a common side layer of p-type, and the crystal is formed with two longitudinal lower separating grooves with their external parts located at the boundary of the p-type common side layer and regional material. In another version, the p-type side layer is provided with a central isolating layer of the n-type, and the crystal is formed with upper and lower longitudinal separating grooves, the bottom of which is located in the central isolating layer of the n-type. A thyristor can be used as a controlled semiconductor rectifying element. In this case the cathode group thyristors include a gate and a cathode at the upper plane of the thyristor structure. The anode group thyristors include a gate and a cathode on the structure lower plane. In both cases, a closed groove separating the semiconductor region located on the side surface from the regions located over the base region of the reverse type conductivity is made, and the gates are formed on the base region of the same type as the side surface layer. Basically, a thyristor controlled from the anode side, i.e. with the gate located at the lower plane, is formed as a four-layer structure with alternating layers of the first and the second conductivity types. This structure contains a cathode, anode and a gate. The gate is arranged at the lower plane of the structure on the p-base region, the cathode is arranged on the p-emitter region and the anode is arranged on the n-emitter region arranged at the p-base region. The p-type region located at the side surface of the thyristor structure is separated from the first and the second conductivity type regions, arranged over the n-base region, by a reserved separating groove surrounding the cathode A thyristor controlled from the cathode side, i.e. with the gate located at the upper plane, is formed as a four-layer structure with different layers of the first and the second conductivity types. This structure contains a cathode, anode and a gate. The gate is arranged at the upper plane of the structure on the p-base region, the cathode is arranged on the n-emitter arranged at the p-base region and the anode is arranged on the p-base region at the lower plane. The thyristor elements, as well as in the diode module case, can be mounted as separate (hybrid) elements, in the form of two monocrystal blocks for anode and cathode groups isolated by an air gap or in the form of an integral circuit. As for thyristor module, any type of the diode module can be used.

For the thyristor controlled from the anode side, a multilayer structure with alternating layers of the first and the second conductivity types with the anode combined with the gate region located on the p-emitter region can be used. In the anode control region of the p-emitter region, a reserved area of the n-type is made, on which a gate is arranged. The n-emitter region involving the cathode is located in the p-base region. The n-emitter region includes a reserved area of the n-type located in such a way that the n-type control region projection is completely located within the closed area, n-type region surrounding the later, and a p-type region located between them. The reserved area of the n-type on the lower plane can have spacings directed radially relative to the control region symmetry axis, and the distance between the spacing is equal to $0.1 \ldots 10\, W_p$, where $W_p$ is the width of the p-base region.

For a semiconductor rectifying element one can also use optothyristors, with a photodetector is a photothyristor and a light source a light emitting guide. In this case the cathode group photothyristors are multilayer semiconductor structures, on the side surface of which second conductivity type layers are located. These layers involve alternating regions of the second and the first conductivity types, on the p-emitter region of which a layer of a conducting material as the cathode is arranged. In the cathode a photo window is made to control the photothyristor light emission. The anode group photothyristors are multilayer semiconductor structures with different regions of the first and the second conductivity types, on the side surface of which a p-type layer and on the upper plane a conducting region are arranged. In the conducting region intended to be an anode a photo window is made on the lower plane of the structure a conducting region with cathode functions is formed. The anode is located on the p-emitter region, the cathode is located on the n-emitter region. In the window zone of the p-emitter region at least one reserved area is arranged, each containing at least one spacing directed radially relative to the reserved area symmetry axis, and the n-emitter region is located in the p-base region. The reserved area is formed as a groove, or n-emitter region is formed as a ring. The reserved area depth must not be more than the depth of the bulk charge area appearing in the p-emitter region at the maximum reverse voltage.

For a semiconductor rectifying element one can also use a symistor which is a multilayer semiconductor structure with different regions of the first and second conductivity types, surrounded by a semiconductor layer of the first and second conductivity types along the side surface separated from semiconductor layers of the structure located over the base region of the opposite conductivity type in reference to the semiconductor layer arranged at the side surface reserved by a separating groove made on the upper plane of the structure and crossing the base p-n junction. The control area includes both p-type regions and n-type regions as well as at least one groove arranged between the gate and the main contacts. There is here a region of at least one conductivity type near it not covered by a metallization. As the latter region one n-type region and one p-type region can be used. The depth of the groove has to be between 0.25 and 0.5 of the depth of the emitter p-n junction being the first from the control area. The width of the groove is more than the depth of the bulk charge layer of the end emitter junction at the maximum gate reverse voltage. The part of the groove corresponding to the p-type region exceeds the bulk charge layer width in this region at the above mentioned voltage. These measures decrease control currents without deterioration of remained parameters.

The semiconductor rectifying element can also be formed as an optosymistor, photodetector of which is a photosymistor (alternating current switch controlled by light). It is a multilayer semiconductor structure with different regions of the first and second conductivity types with shunted end emitter junctions, on the side surface of which a semiconductor layer of the first conductivity type separated from semiconductor layers of the structure located over the base region of the contrary conductivity type by a separating reserved groove crossing the base p-n junction is formed. The emitter p-n junctions are shunted. Conducting areas with the main electrodes and the gate area are arranged at the upper and lower planes. A photo window is made in the electrode of the upper plane, so that the end n-type layer projections overlapping in the photo window zone to one of the main structure plains takes place. Within the n-type region located at the lower plane under the photo window between the symmetry axis and the p-type ridge boundary on the lower plane, a p-type area as a reserved figure is arranged. The reserved figure can be a round, oval, or a part of a ring, the symmetry axis of which is coincident with the axis of the gate. The n-type ridge at the upper plane in the photo window zone can have a groove with the symmetry axis which is coincident with the symmetry axis of the control area, and the most remote point of the groove is located between the symmetry axis of the control area and the photo window boundary. Between the above mentioned p-type region and the p-type region under the main contacts as a version, a channel of the p-type connecting these regions is arranged. Moreover, as a version, a round area of the hole type, a ring area of the hole type, with the symmetry axis coincident with the symmetry axis of the control area, are made at the n-type ridge of the upper plane. These measures make it possible to lower the control power and to raise the value of the photosymistor. In case when photosymistors and photothyristors are use as light source, a semiconductor light emitting diode is arranged over each of them.

As described above, a separating groove is a necessary component of the rectifying module. In this case the groove dimensions are stipulated to provide the maximum breakdown voltage of the blocking p-n junctions, namely, the structure surface groove width does not exceed 1.5 of $W_n$, the groove depth h is limited by $x_j+\Delta x_{ck}<h<x_j+0.5\ W_n$, where $W_n$ is the n-base region depth, $x_j$ is the depth of the p-n junction formed by the base regions, $\Delta x_{ck}$ is the length of the compensated layer in the n-base region. A further improvement of the groove shape is a ledge with the step of no less than 1.5 $W_{O3}$, the ledge depth is no less than $x_j+\Delta x_{ck}$, where $W_{O3}$ is the bulk charge area width in the n-base region. The step of the ledge can be arranged at an angle of 1 ... 20 grade relative to the p-n junction formed by the base regions and can cross the above mentioned junction.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

BRIEF DESCRIPTION OF THE DRAWINGS

FIGS. 19 and 20 are views showing a cross-sections of the anode and cathode groups;

DESCRIPTION OF THE PREFERRED EMBODIMENTS

Figure 1A:
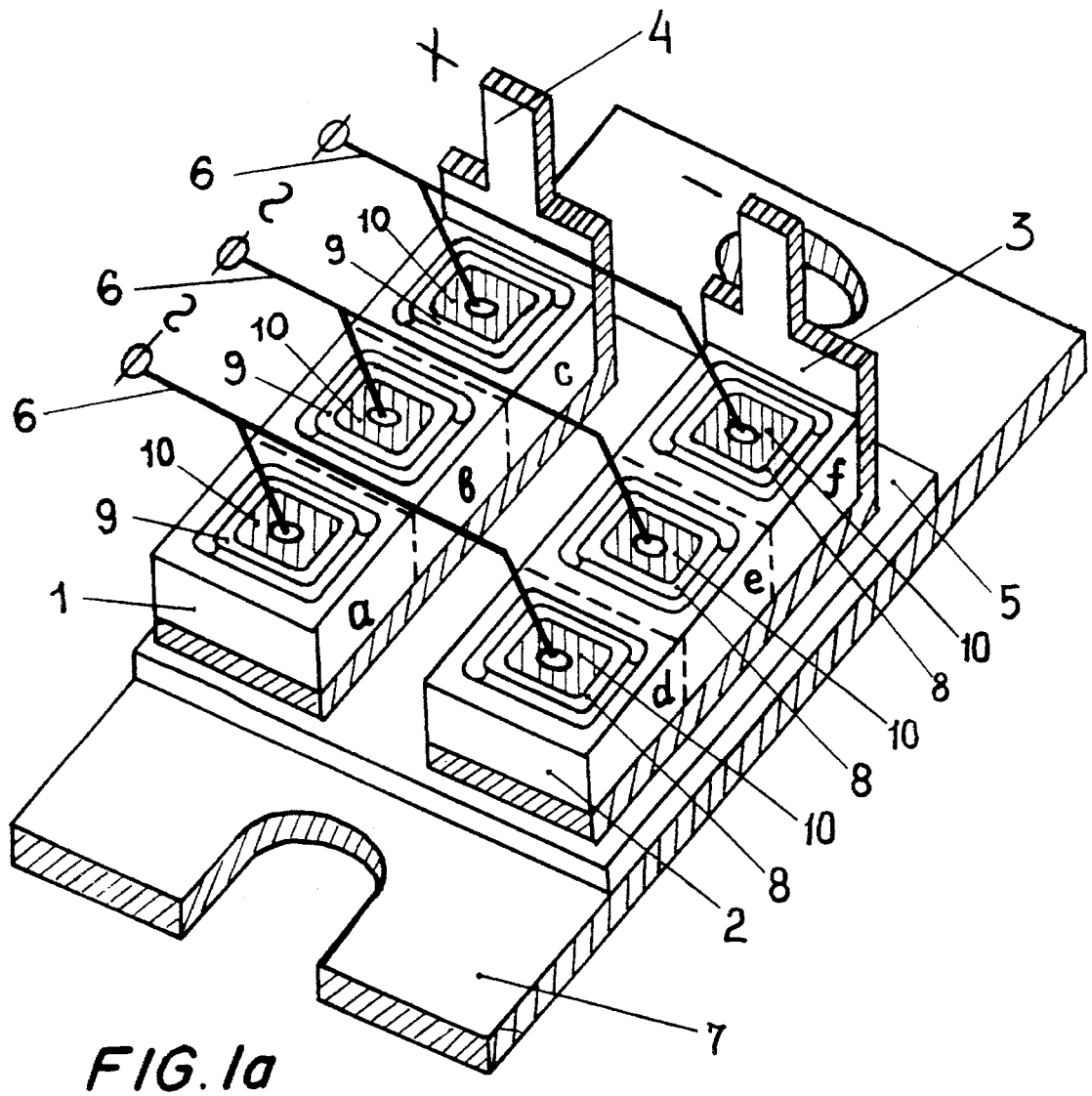
FIG. 1 is a view showing a three-phase diode bridge rectifier, anode and cathode groups of which are mounted on metal plates in accordance with the present invention.

The invention relates to rectifying modules with diodes, thyristors, triacs (symistors), photothyristors and photosymistors as the rectifying elements. Some versions of products made on the basis of the invention are possible. These are double-element modules of oppositely connected elements with one common point, three-element unidirectional modules with common point, single-phase rectifying bridges, three-phase rectifying bridges, multiphase rectifying bridges, multi-element unidirectional assemblies with common point, etc. As an example of the invention, a three-phase rectifying bridge is chosen. On the one hand, it is a widely used type of the bridge rectifiers, and on the other hand, this is the most common case, on the basis of which one can provide a single-phase rectifying bridge, a double-element module of oppositely connected elements with one common point, an assembly with several unidirectional elements with one common point etc.

A diode module of the three-phase bridge rectifier (FIG. 1) contains anode 1 (3 diodes) and cathode 2 (3 diodes) groups mounted on metal plates 3 and 4 used as current leading out electrodes. The anode group cathodes and the cathode group anodes are in contact with plates 4 and 3 correspondingly. In case of integral technology the anode and cathode groups are made in separate crystals. The isolation of the groups from metal base 7 is made by means of insulation spacer 5. The diodes are connected by current leading in electrodes 6 being at the same time contacts of the three-phase alternating current circuit as well. The contact with the semiconductor crystal upper plane is made through a metal layer 10, which in case of the cathode group is in contact with n-type semiconductor 8, and in case of the anode group is in contact with p-type semiconductor 9. In hybrid case the anode group consists of three (a, b and c) butt-connected diodes. Correspondingly, the anode group consists of d, e and f elements. The possibility for the group to be realized in a single crystal (an integral circuit) and for the elements to be butt-connected within a group (a hybrid circuit) is provided due to the fact that every rectifying element is surrounded from the flank sides by a p-type layer, which with the groove reaching the initial n-type material, assures isolation of high voltage junctions.

Figure 2:
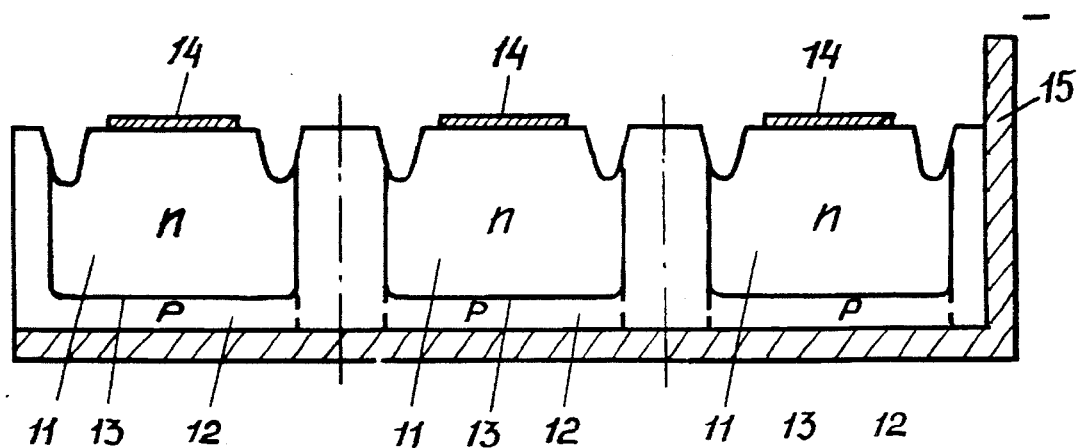
FIG. 2 and FIG. 3 are views showing cross-sections of the cathode and anode groups.
Figure 3:
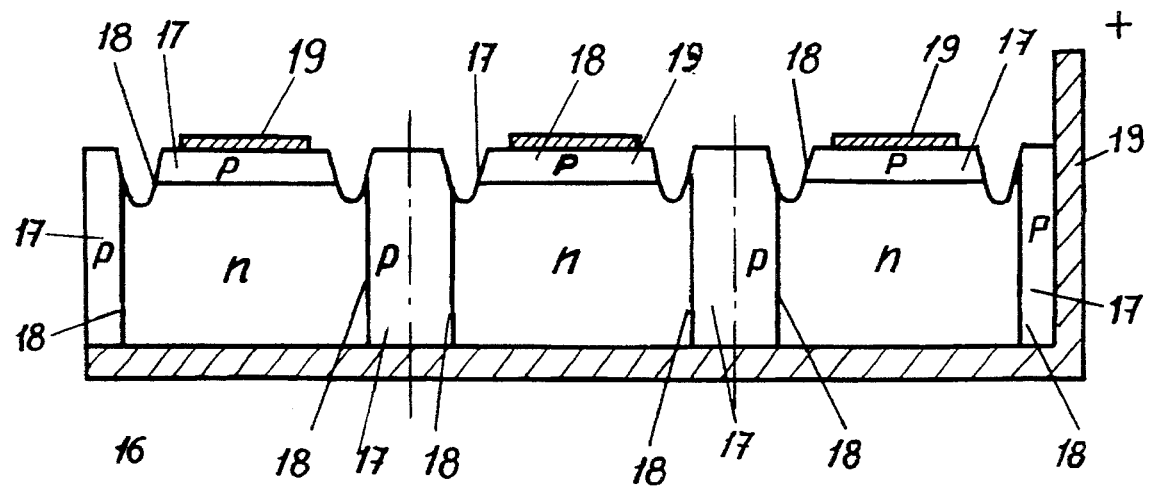

FIGS. 2 and 3 illustrate the isolation system. In FIG. 2 a cross-section of a cathode group formed in n-type initial semiconductor 11 (the base of the diodes) is presented. P-layer 12 is simultaneously the emitter of the diodes (the law horizontal part) and the isolation element of p-n junction 13 (the vertical part).

The semiconductor crystal with the diode elements is mounted on common metal base 15. The other contacts 14 are made to each element in FIG. 3 a cross-section of the anode group formed in n-type initial semiconductor 16 (the base of the didoes) is presented. P-layer 17 is simultaneously the emitter of the diodes (the upper horizontal part) and the isolation element of the base (the vertical part), the isolation being made by means of p-n junction 18. Contacts to the semiconductor crystal are realized through a common ground and upper metallization 19.

Figure 1B:
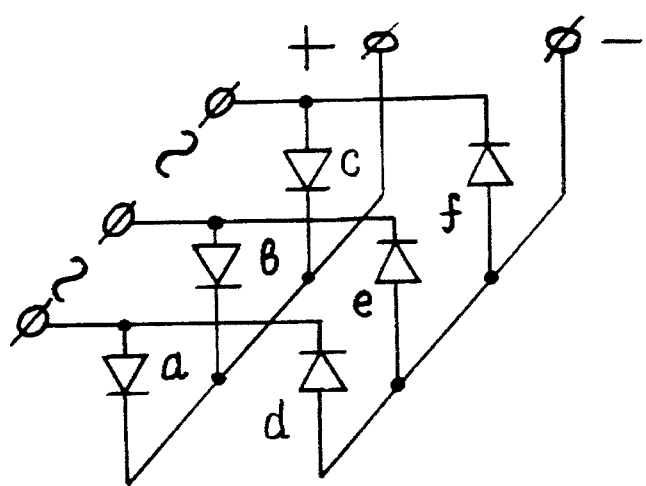

Intergroup isolation in FIG. 1 is carried out by means of the fact, that the diode groups from the one side are mounted on insulating substrate 5 (FIG. 1), and from the other side an air gap is between the diode groups. To decrease the distance between the groups this gap is filled by an insulating material, for example, an organosilicon compound.

In the hybrid version crystals in FIGS. 2 and 3 are divided into three fragments, as is shown by dot-and-dash lines, and every fragment is butt-mounted onto the common ground. The module in FIG. 3 consists of two groups of diodes isolated from each other. Nonetheless a bridge rectifier can be formed in a single monocrystal.

Figure 4:
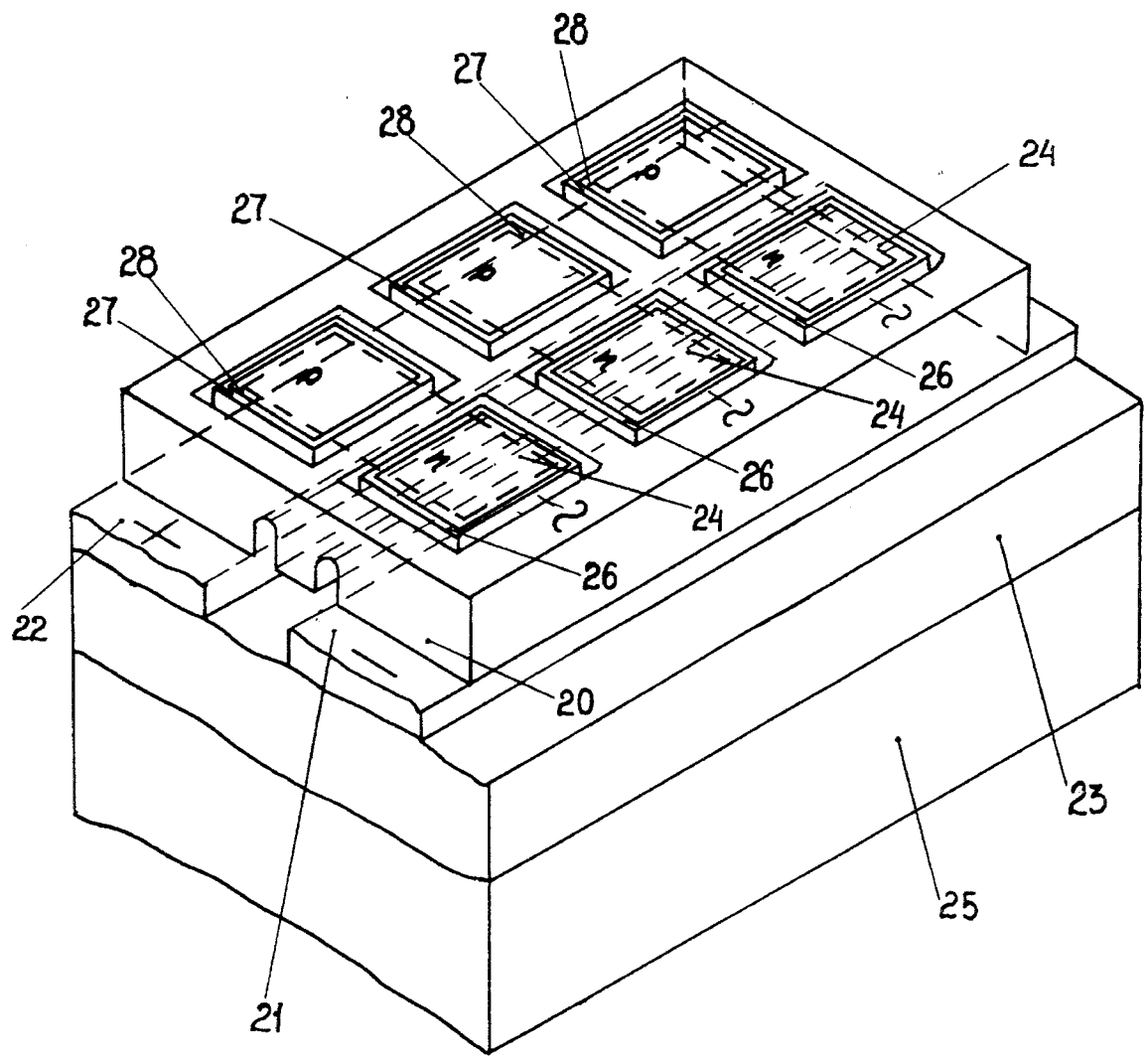
FIG. 4 is a view showing an integral circuit of the three-phase diode bridge rectifier, made in a single monocrystal; the upper contact connections are not show, they are the same as in FIG. 1.
Figure 5:
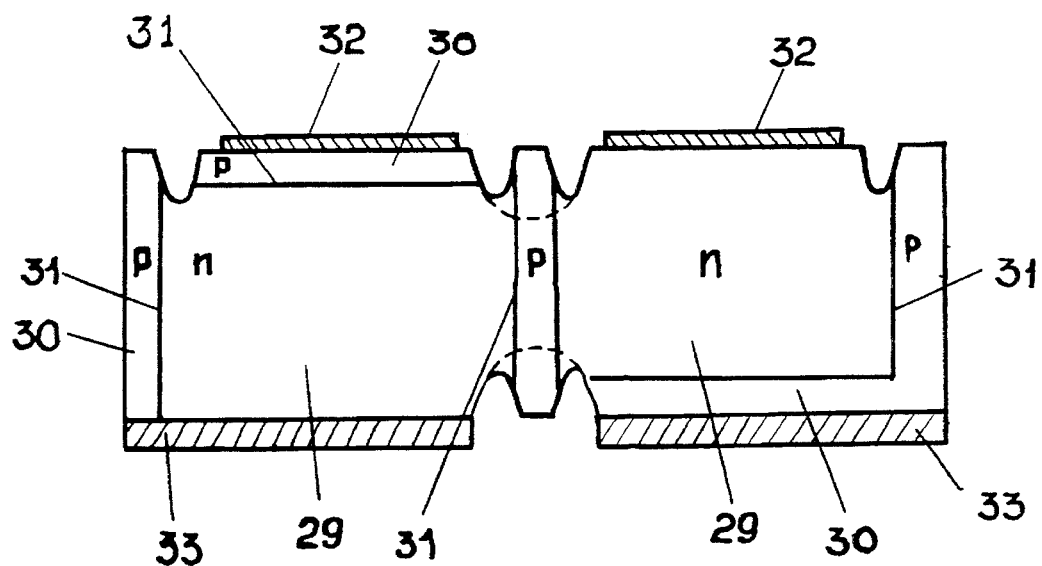
FIGS. 5 and 6 are views showing cross-sections along the plane perpendicular to isolating longitudinal grooves for two versions of the isolation between the anode and cathode groups.

In FIG. 4 a monocrystal of a three-phase bridge rectifier 20 is presented. It is mounted on metal current bars 21 and 22 fastened to isolated plate 23 and 24 located on the heat removal 25. The cathode group of the diodes contacts with the common plate 21, and every diode element of the cathode group on the upper plane has a metallization 24 deposited on an n-type area 27 coming out to the upper plane of the diode elements. The anode group of the diodes contacts with the common plate 22, and every diode element of the cathode group on the upper plane has a metallization 28 deposited on a p-type area 27. The upper contact system is similar to FIG. 1. The upper plates linking metallization of the groups 24 and 28 are shown by dashed lines. Intragroup isolation is formed by means of grooves surrounding the diode elements of the upper plane along the perimeter. The groove bottom is located in the initial material of the n-type. Intergroup isolation is performed by two ways. In FIG. 5 being a cross-section of the crystal shown in FIG. 4 it is carried out either using two grooves located at the lower plane and crossing overall the crystal (FIG. 4), and upper grooves being fragments of intragroup isolation, or using one upper and one lower groove, as illustrated in FIG. 5 by dashed lines. The cross-section of the crystal shown in FIG. 5 is a combination of two diode structures made on the base of the n-type initial material being the base 29 and the highly doped p-layer 30 forming with the base 29 a p-n junction 31. The diode structures have contacts 32 and 33.

Figure 6:
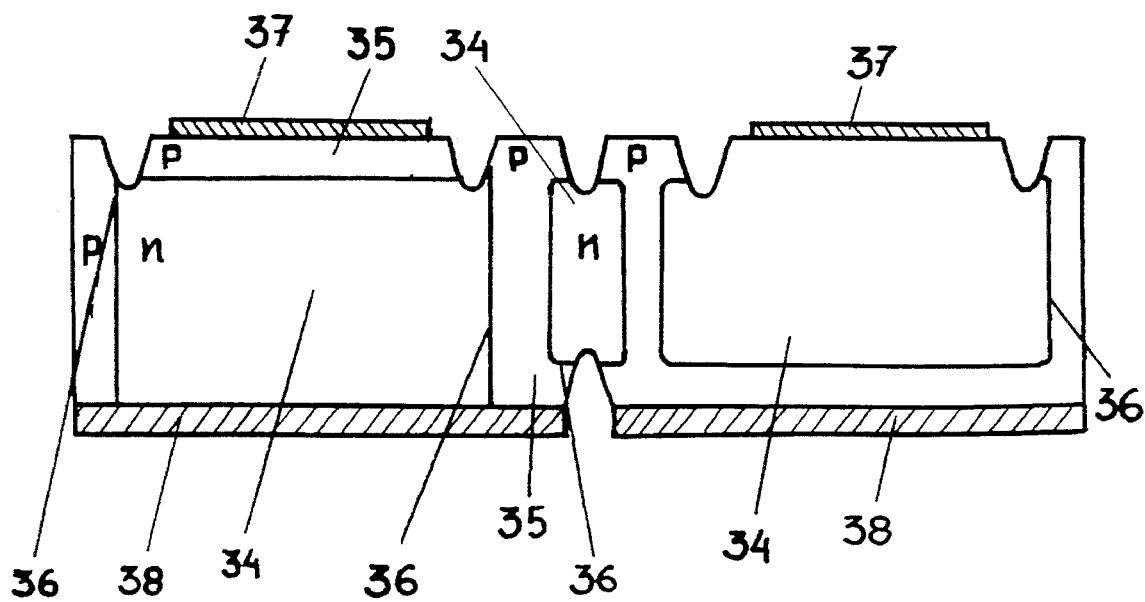

In FIG. 6a another version of the intergroup isolation of the anode .and cathode groups formed in the initial n-type semiconductor 34 is presented. A highly doped layer 35 forms a p-n junction 36 at the boundary with a p-layer 34. The diode elements have upper contacts 37 and lower ones 38. The isolation between diode elements in FIG. 6 (intergroup isolation) is realized by means of a central isolating layer of n-type surrounded from all sides by layers of p-type and by means of an upper and of a lower isolating groove cross overall the crystal. Bottoms of the grooves are located in the central isolating layer of n-type.

Figure 7A:
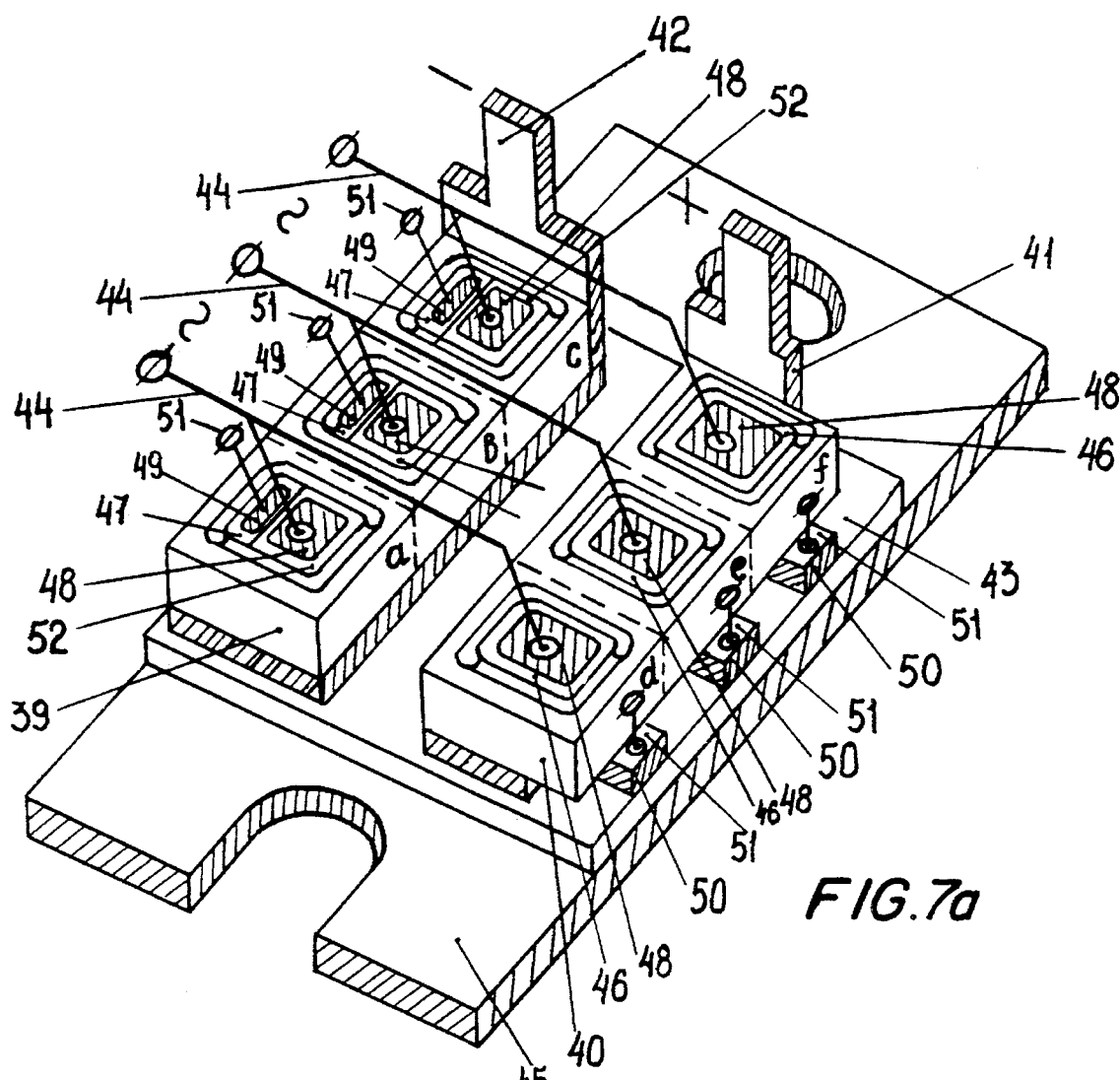
FIG. 7 is a view showing a three-phase thyristor bridge rectifier, anode group thyristors of which have control area led out to the lower plane of the crystal.
Figure 7B:
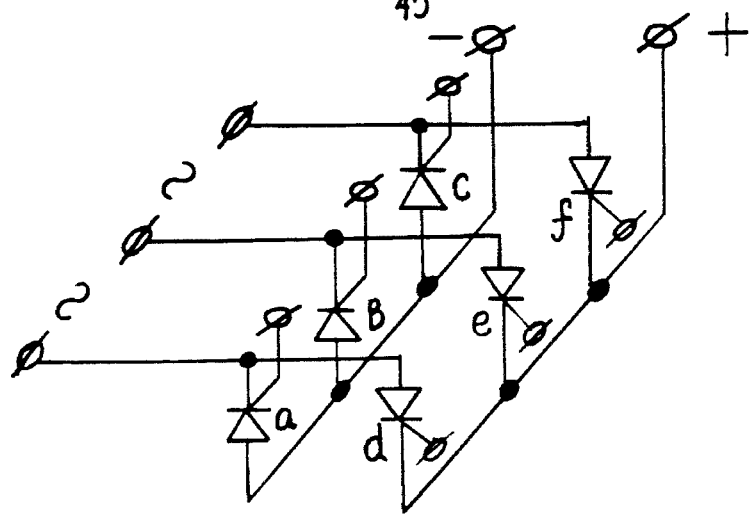
Figure 8:
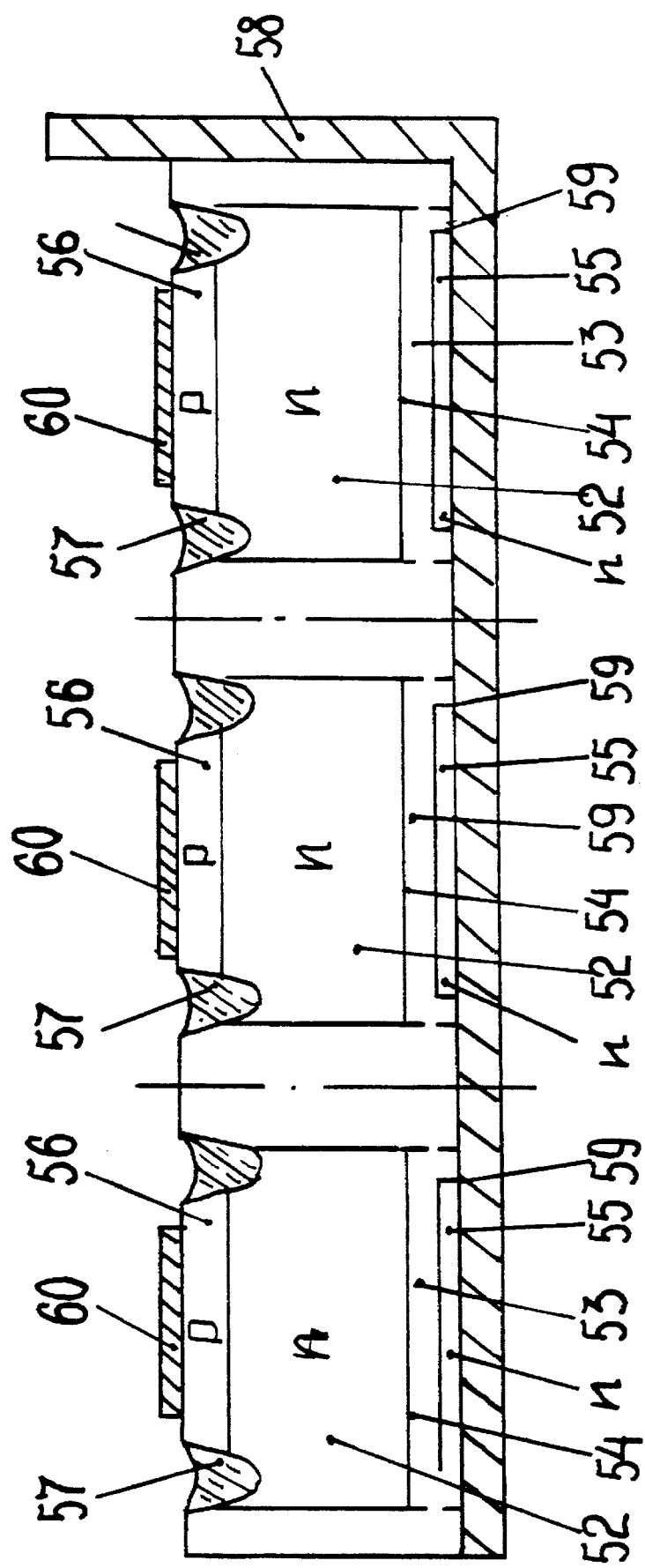
FIGS. 8 and 9 are views showing cross-sections of the anode and cathode groups.
Figure 9:
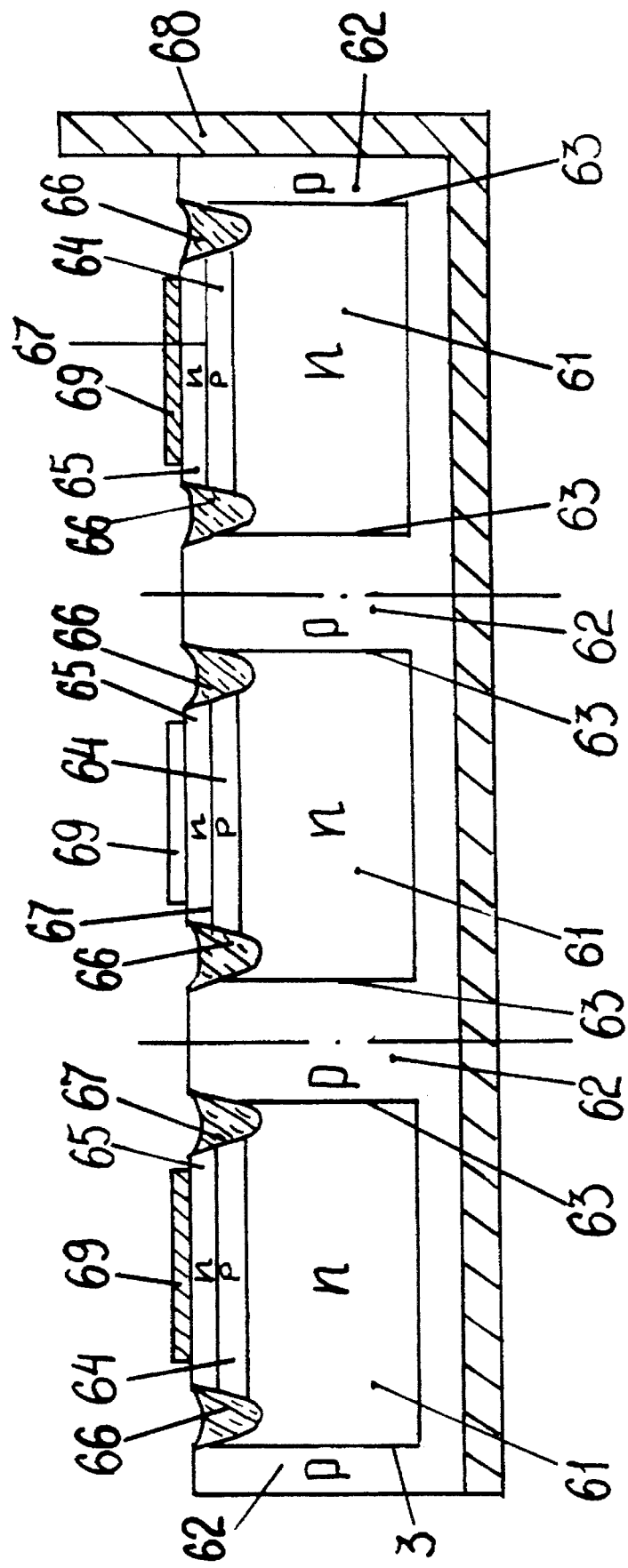
Figure 10:
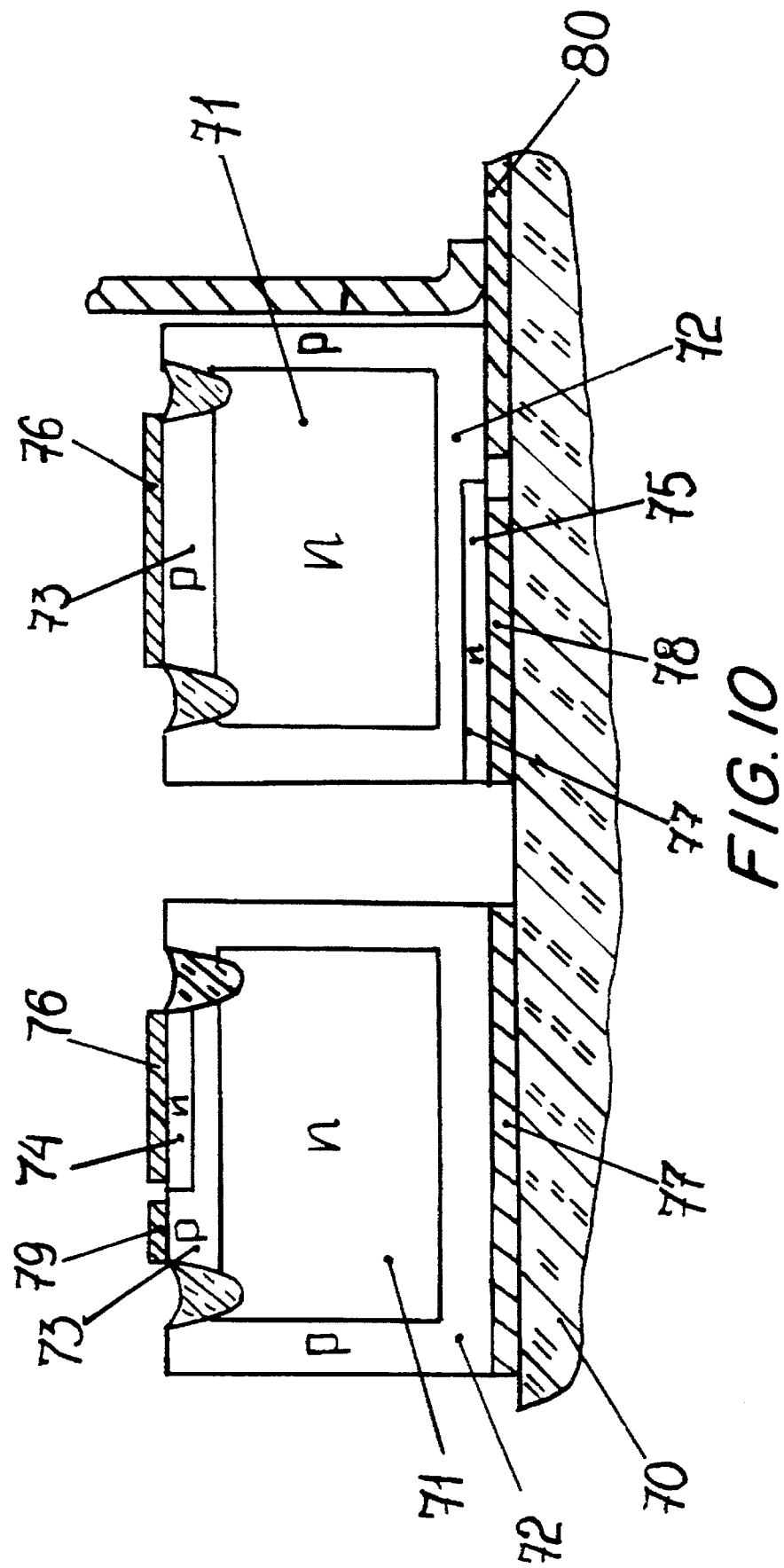
FIG. 10 is a view showing the rectifier made along the main contacts.

In FIG. 7 a thyristor module of a three-phase bridge controlled rectifier is shown. Two semiconductor crystals with thyristor cathode group 39 and thyristor anode group 40 are its basis. The crystals are mounted on common metal plates 41 and 42 being current leads of the rectifier. These plates are separated from heat removal 45 by isolating plate 43. Thyristors are connected by conductors 44 being at the same time contacts of the three-phase alternating current circuit as well. P-layer 46 is located on the upper plane of the anode group thyristors. The control area of cathode group thyristors 47 has conductivity of p-type. The remaining part of the surface of the cathode group thyristor elements mostly has n-type conductivity 52. The cathode group thyristors has a metallization of control area 49 and main contact 48. Besides current lead plates 41 and 42, on the isolating plate metal plates 50 contacting with the control areas of the anode group thyristors are located. Control leads 51 are connected to plate 50 and metallization areas 49. FIG. 8 being a longitudinal section of the anode group illustrates its design. The anode group is realized in the initial crystal of n-type forming n-base 52. Under it p-base 53 and n-emitter 55 are located. The 52, 53 and 55 layers form p-n junctions 54 and 59. To the structure upper plane p-type layers 56 forming with layer 52 p-n junction 57 come out. Plate 58 is the common contact. At upper p-type layers 56 contacts 60 are located. In FIG. 9 a longitudinal section of the thyristor cathode group formed in the initial n-type semiconductor forming n-base 61. P-emitter 62 is under it, their boundary being p-n junction 63. P-base 64 is over base 61, and over it n-emitter 65 is located. Under it p-emitter 62 is disposed. The boundary of these areas is p-n junction 63. P-base 64 is located over n-base 61, and over it n-emitter 65 is situated. These three areas form p-n junctions 66 and 67. The crystal with thyristor elements is located on the common current lead plate 68. Upper contacts 69 are disposed on upper p-emitters 65. A cross-section of the bridge rectifier shown in FIG. 7 is presented in FIG. 10. The left part is a cross-section of the cathode thyristor group, the right part is a cross-section of the anode thyristor group formed on the basis of initial n-type semiconductor 71 forming n-base of the thyristors. From the bottom and flank sides n-base 71 is surrounded by p-layer 72, from the top it borders on p-base 73. N-emitter 74 of the cathode group and p-emitter 73 of the anode group have upper metallization 76. On the lower plane base current leads 77 and 78 and current lead 80 of the control area are located.

In the hybrid version the anode and cathode groups of thyristors are formed of three butt-connected thyristors. It is possible due to a side p-layer surrounding the every thyristor element.

Figure 11:
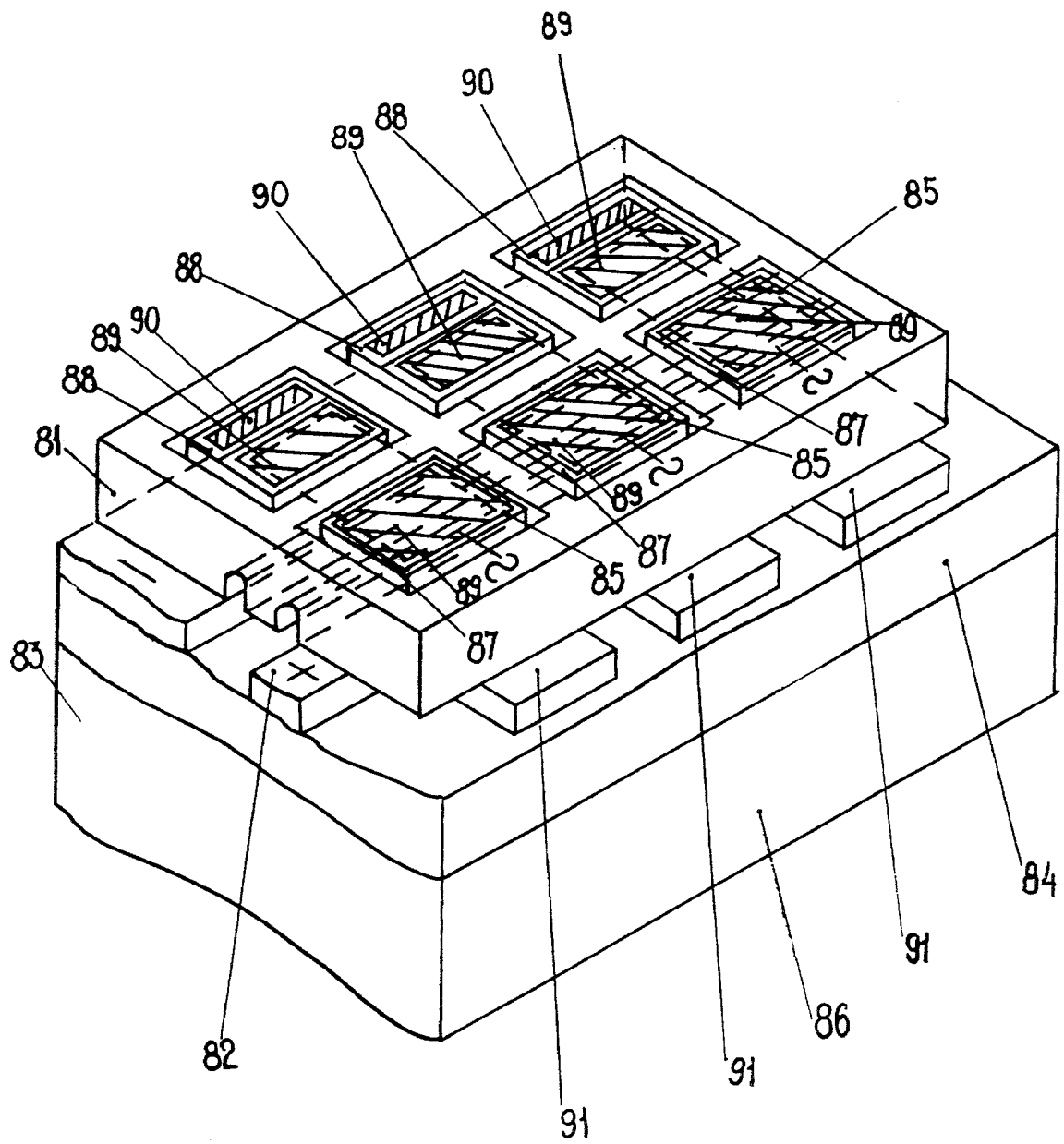
FIG. 11 is an illustration of the thyristor bridge rectifier carried out in a singe crystal.

In FIG. 11 a three-phase thyristor bridge rectifier formed in single monocrystal 81 is shown. It is situated on two current leading plates 82 and 83 contacting with isolating spacer 84 located on heat removal 86. Metallization 85 of the upper plane forms base contacts to p-area of anode group 87. Metallization 89 forms a contact to the n-area, and metallization 90 forms a contact to the p-area of the cathode group thyristor control. Plates 91 are current leads for the anode group thyristor control area. The external lead system in FIG. 11 is not shown, because it is similar to one displayed in FIG. 7.

Figure 12:
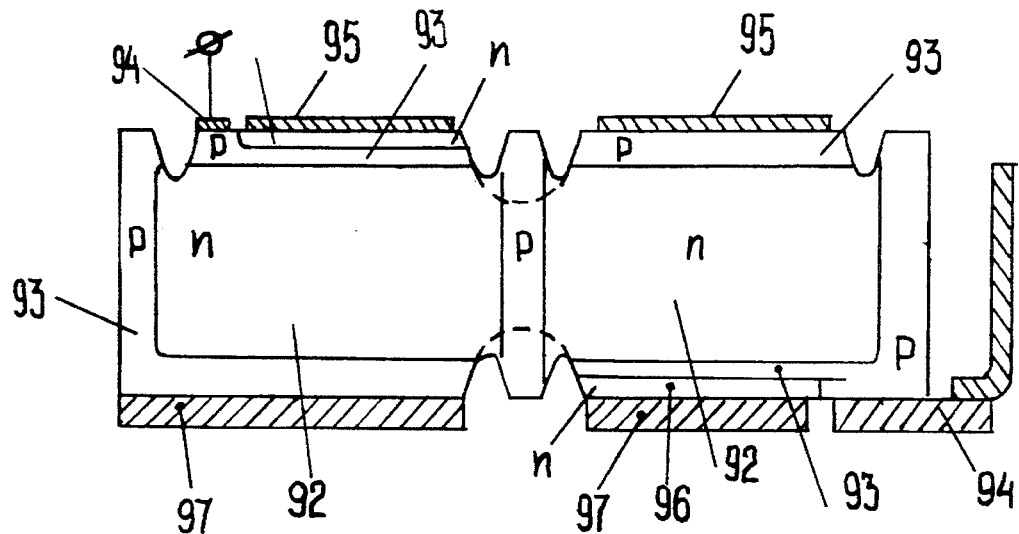
FIGS. 12, 13 are views showing versions for the single-crystal thyristor bridge rectifier, anode group thyristors of which have a gate located from the anode plane side, they are realized as the previous version, across section of the rectifier for two versions of the isolation between the anode and cathode groups is shown in FIG. 13.

The intragroup isolation is made using grooves on the upper plane surrounding by perimeter the thyristor elements. The bottom of the grooves is located in the initial material, and the outer edge approaches the side areas of p-type. Cross-section of the bridge rectifier demonstrating the intergroup isolation system is presented in FIG. 12. The isolation is made either by means of two grooves located on the lower plane and crossing all the crystal and upper grooves being fragments of the intragroup isolation, or using one upper and one lower grooves, situated one opposite another as is illustrated in FIG. 12 by dashed lines. The cross-section of the rectifier (FIG. 12) is a combination of two thyristor structures made on the basis of the n-type initial material being n-base 92 containing highly-doped p-layers 93 and highly-doped n-layer 96. On upper and lower layers 93 and 96 metallization 95 and 97 is deposited. Metallization 94 is deposited on the upper and lower p-type control area.

Figure 13:
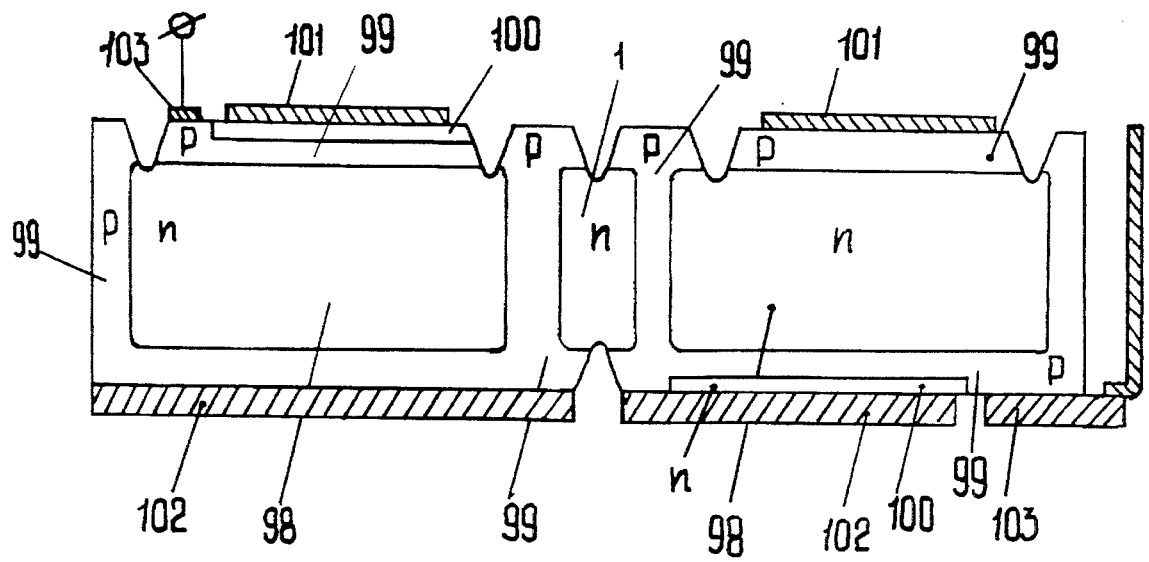

In FIG. 13 another version of the anode and cathode thyristor intergroup isolation realized in initial n-type semiconductor 98 is presented. The semiconductor thyristor structures contain highly-doped p-layers 99 and highly-doped n-layers 100. On the upper and lower planes metallization of main contacts 101 and 102 are deposited. The control areas have metallization 103.

Figure 14A:
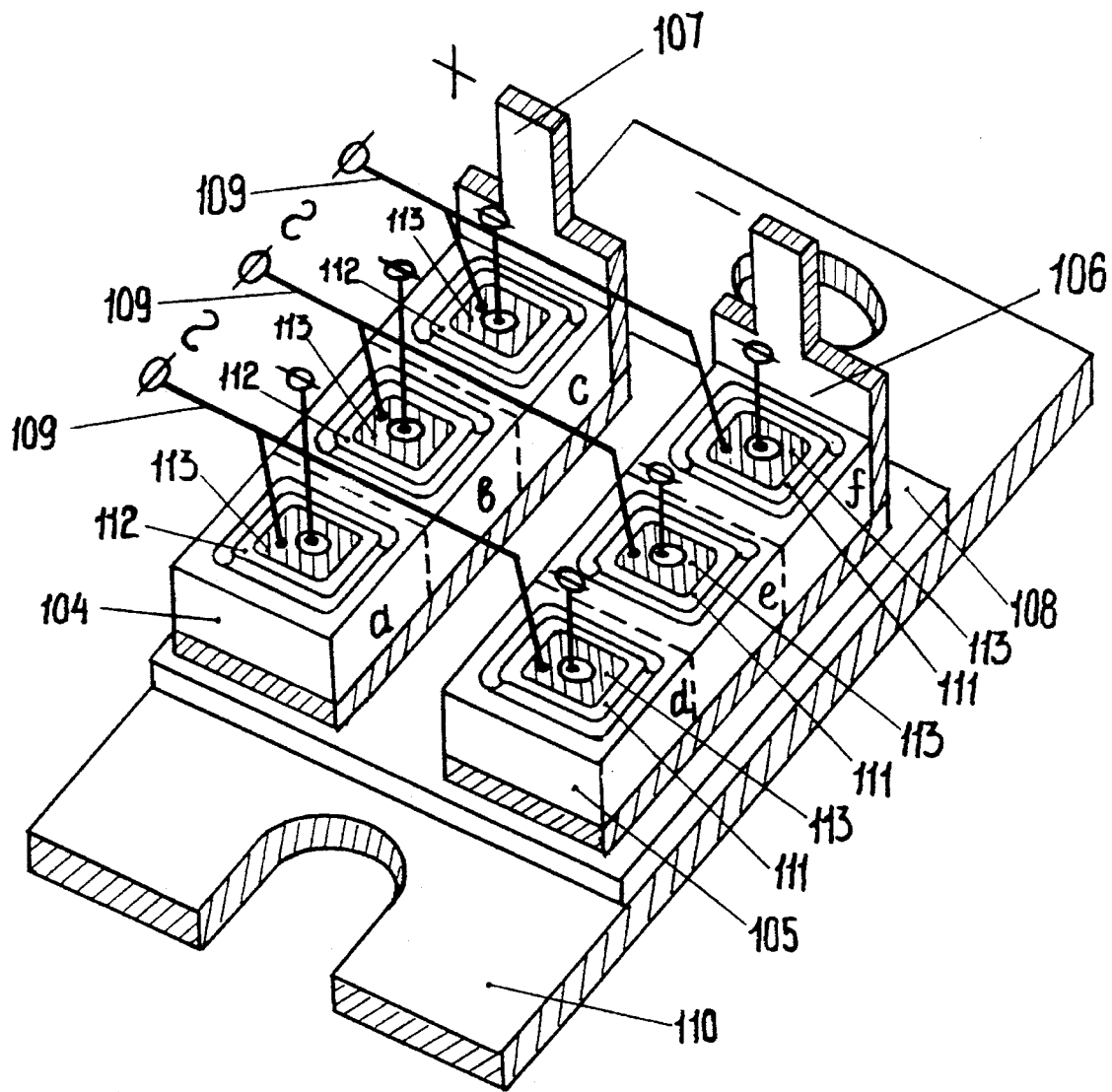
FIG. 14 is a view showing three-phase thyristor bridge rectifier, anode group thyristors of which have a gate connected from the anode plane side.
Figure 14B:
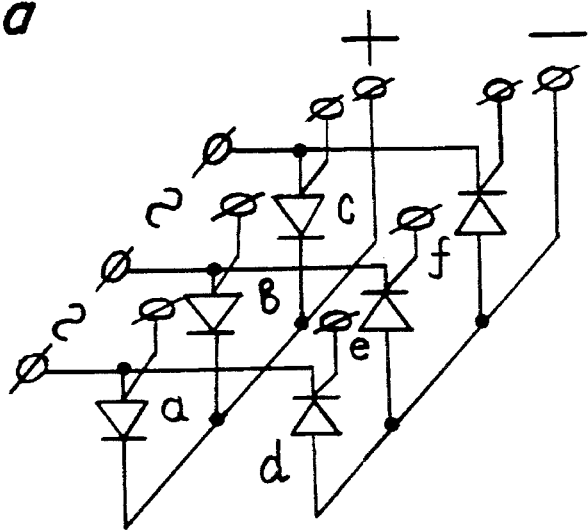

In FIG. 14 a module of the bridge thyristor rectifier in a three phase version is shown.

Figure 15:
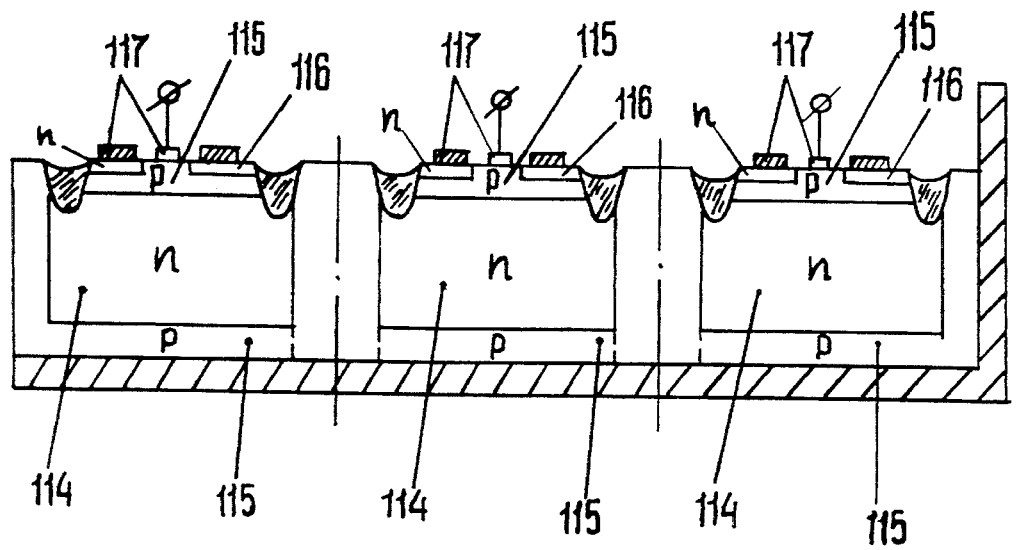
FIGS. 15, 16 are views showing cross-sections of the anode and cathode groups.
Figure 16:
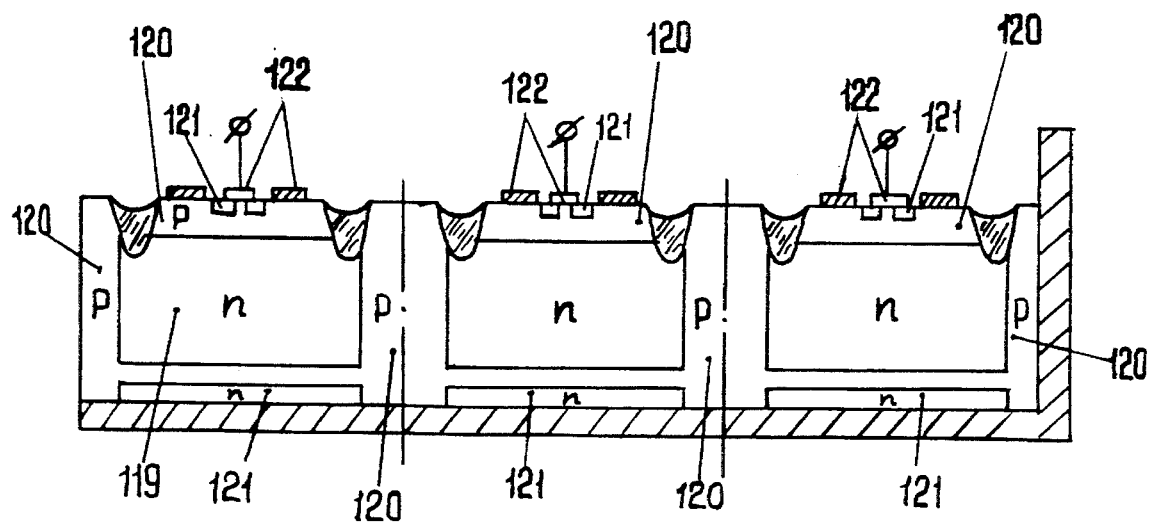
Figure 17A:
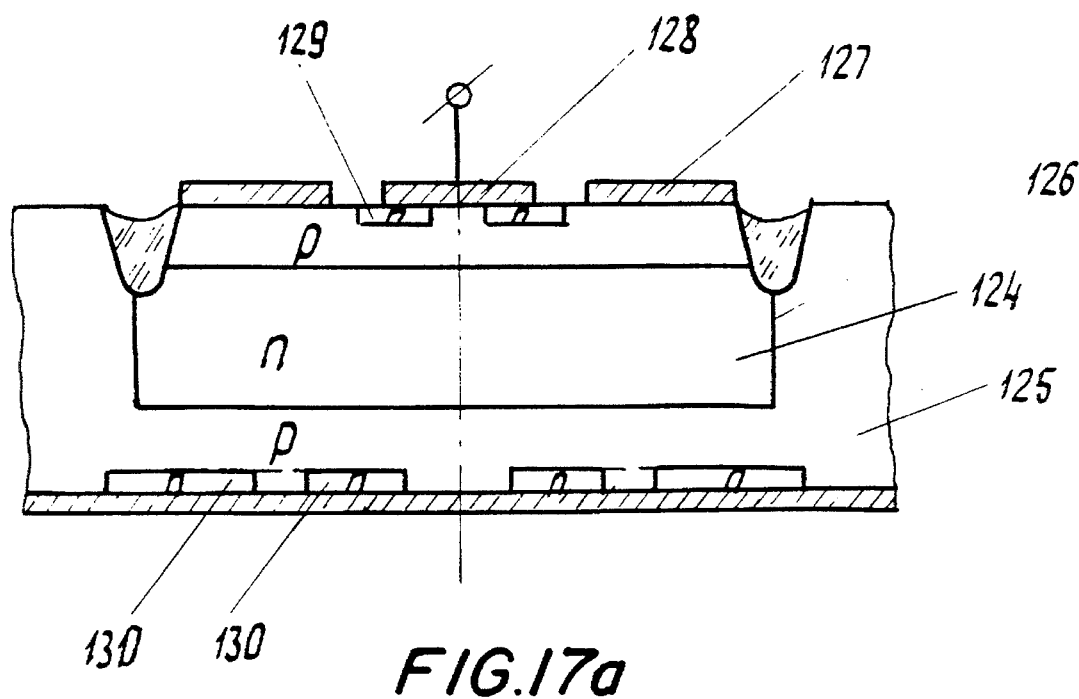
FIG. 17 is a view showing a cross-section and a top view of the anode group thyristor.
Figure 17B:
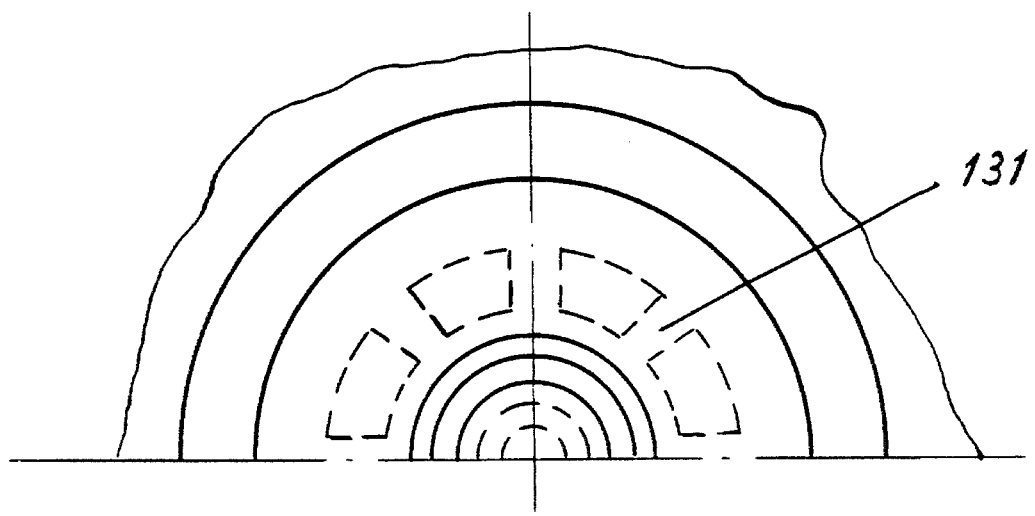

In FIG. 15 a cross-section of the cathode thyristor group and in FIG. 16 a cross-section of the anode thyristor group are presented. In FIG. 17 an example of the thyristor structure controlled from the anode side is presented. A single crystal version of the thyristor rectifier module with its anode group thyristors having gates located on the anode side are realized similar to the previous version (FIG. 12, 13).

The unit (FIG. 14) contains heat removal 110 with electric isolating heat conducting spacer 108. Two metal plates are mounted on spacer 108. On plate 107 anode group thyristors 104 are located, on plate 106 cathode group thyristors 105 are located. To the thyristors of groups 104 and 105 current leads 109 on the upper plane side are led up.

The cathode group thyristors (FIG. 15) are realized on the basis of initial n-type material 114 and contain highly-doped p-layers 115, highly-doped n-layers 116. Upper plane metallization 117 covering the highly doped n-layer and a p-type control area coming out to the upper plane. The crystal is mounted on current lead The anode group thyristors (FIG. 16) are formed on the basis of the initial n-type material 119 and contain highly-doped p-layers 120, highly-doped n-layers 121, upper plane metallization 122 covering the highly-doped p-layer 120 and a control area concluding n-type 121 and p-type regions.

The unit operates as a usual thyristor rectifier. The only feature of it is the operation of the anode group thyristors (FIG. 16). After the control signal of negative polarity is supplied, electron injection from n-layer starts. The electrons come to n-base 119, reduce its potential relative to the p-layer of upper p-layer 120 and cause injection of holes into n-base 119. The switching-on mechanism is similar to the switching-on when connecting a gate to an n-base. It makes it possible to place the gates of the both groups at the single (upper) plane and to reduce dimensions of the unit. On the other hand, a five layer n-p-n-p-n structure in the control area leads to the effect known in the triacs as the (dv/dt) com effect or to a non-controlled transition of the structure into conducting state at high rates of voltage commutation.

To eliminate the phenomenon special measures are taken, the essence of which is clear from FIG. 17. Here a fragment of the anode group thyristor is shown (a cross-section and a top view) formed in initial n-type material 124. The thyristor structure also consists of highly-doped p-type layers 125 and n-type 129 on the upper plane and 130, 131 layers on the lower plane. The n-type areas have the shape of a ring. These rings are connected by means of n-type regions 131 on the lower plane. From the bottom the thyristor structure is covered by continuous metallization, from the top, control area 128 metallization is performed as a round and main part 127 of the structure is made as a ring. Under this design, at first the switching-on is formed in a small n-type ring, then this state is spreading along regions 131 and reaches the main part of the structure. When it is switched on, the area of the structure over the small n-type ring practically does not conduct any current, it has a lower temperature and a higher endurance to the (dv/dt) com effect.

Figure 18:
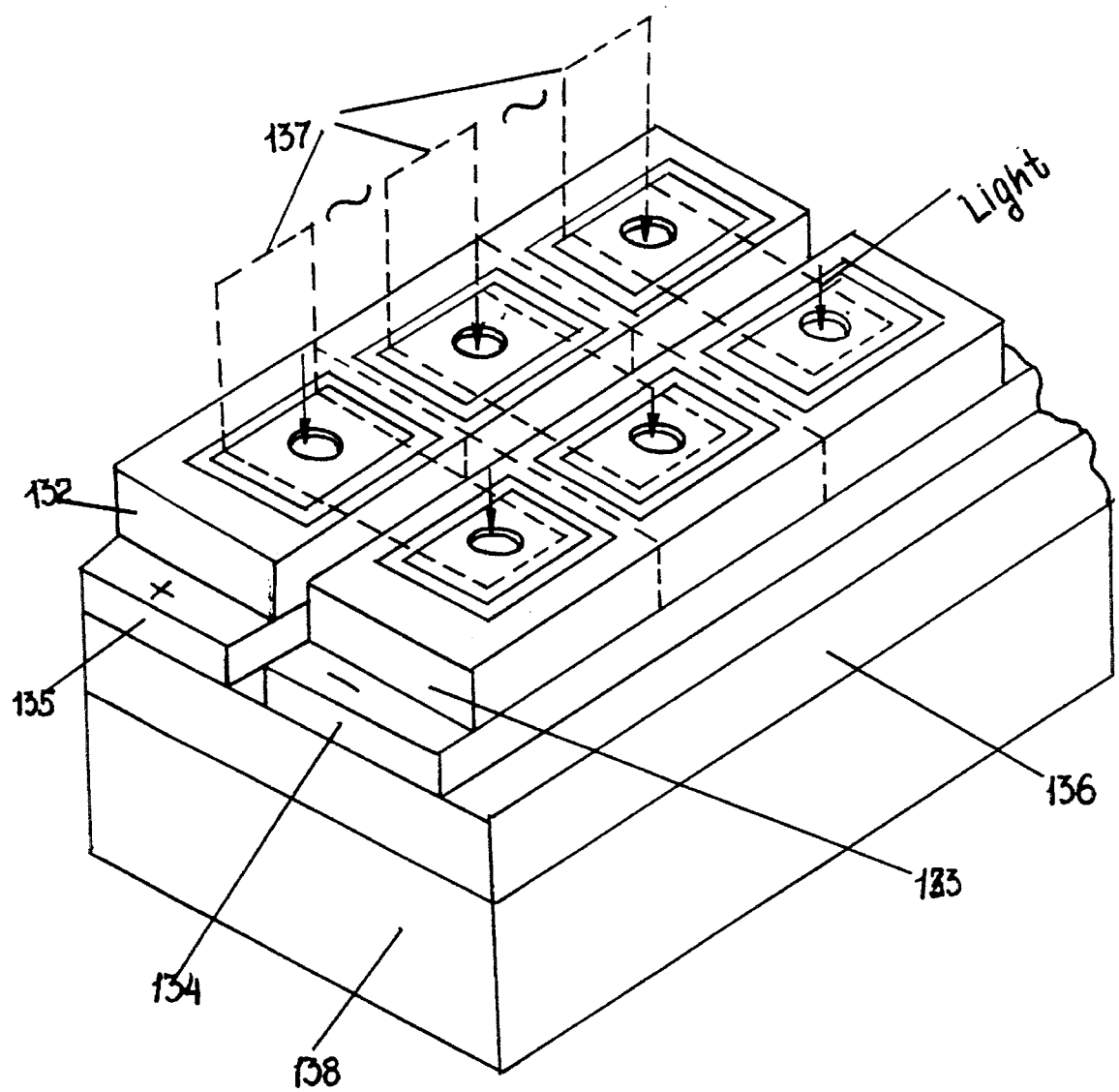
FIG. 18 is a view showing an optothyristor three-phase bridge rectifier, LEDs are not shown.

For these cases, when there is a necessity to isolate a control circuit from the main one, a module with photothyristors or optothyristors as the main elements is proposed. In FIG. 18 a photothyristor version of the three phase bridge rectifier with an isolated input is presented. In case of an optothyristor version a light-emitting diode is located over the every photothyristor. The unit consists of two photothyristor groups: anode 132 and cathode 133 mounted on current leads 135 and 134 situated on isolated plate 136 being in contact with heat removal 138. System of alternating current supply 137 is shown by dashed lines.

FIG. 19 explains features of the cathode group photothyristors. They consist of n-type base (initial material) 139, highly-doped p-base 141, p-emitter 140 and n-emitter 142. On the upper plane from the side of which light is supplied, metallization 143 is deposited. On the lower plane there is common metallization 144.

Figure 21:
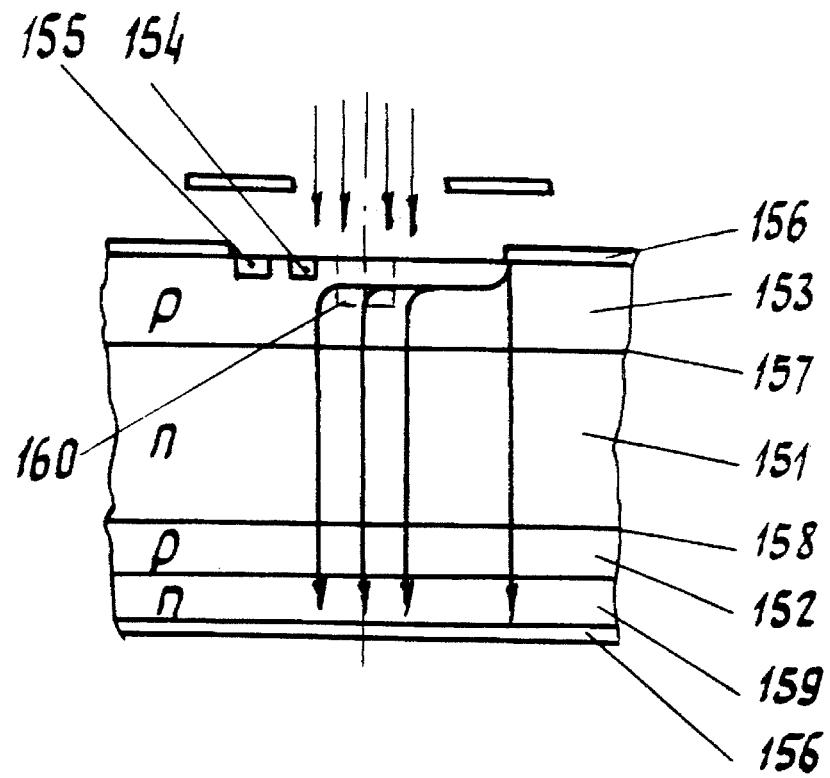
FIGS. 21 and 22 are views showing a cross-section and a top view of the photothyristor controlled from the anode side.
Figure 22:
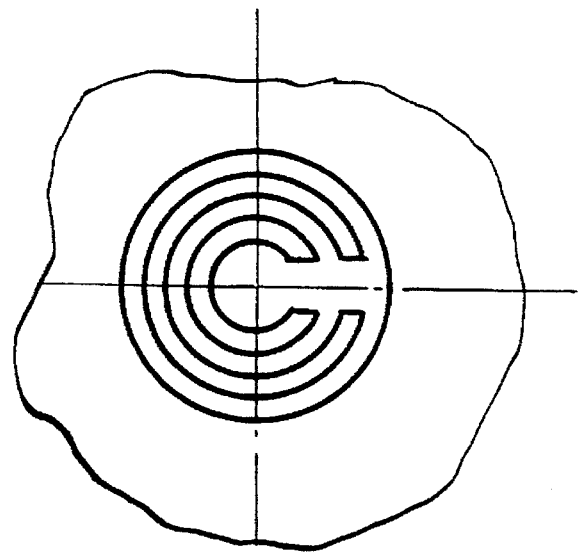
Figure 23:
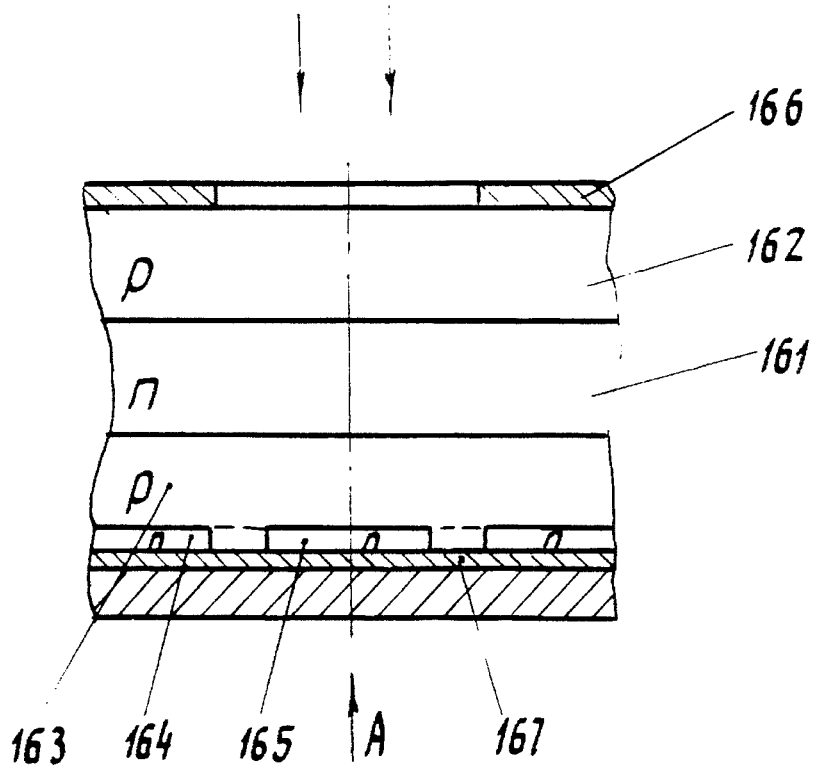
FIGS. 23 and 24 are views showing a cross-section and a bottom view of the photothyristor controlled from the anode side with improved dynamic characteristics, the design of the single-crystal optothyristor three-phase bridge rectifier is similar to FIGS. 11, 12, 131.
Figure 24:
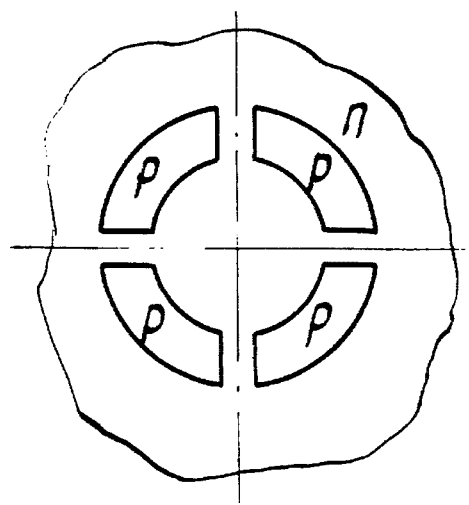

FIG. 20 explains features of the anode group photothyristors. They consist of n-type base (initial material) 145, p-base 146, p-layer 147 forming the emitter and the side layer, and n-emitter 148. On the upper plane, from the side of which light is supplied, metallization 149 is deposited. On the lower plane there is con, on metallization 150. As is clear from FIGS. 19 and 20, the cathode and anode groups of photothyristors are controlled by light from the cathode and anode sides correspondingly. As the anode group of photothyristors is controlled from the anode side, for being switched on they demand more control power, than the cathode group thyristors controlled from the cathode side. To achieve symmetrical control of the both groups some measures are proposed to reduce control power without any essential decrease of other parameters (switching voltage), rise rate of the anode voltage, etc.). These measures are illustrated in FIGS. 21 and 22 in which a cross-section of the control area and a top view of a photothyristor controlled from the anode side are presented. The structure of the photothyristor in FIG. 21 contains n-base 151, p-base 152, p-emitter 153, n-emitter 159 of n-type areas 154 and 155 on the upper plane of the structure. In the process of dividing carriers (holes and electrons generated by light) take part basically p-n junctions 157 and 158. The structure has a metallization on upper and lower plane 156. Areas 154 and 155 have the form of rings with a discontinuity (FIG. 22) oriented radially relative to the symmetry axis. This fact provides localization of the photo current in the place of the discontinuity and makes it possible to reduce control power. Ring areas 154 and 155 with the discontinuity can be replaced by grooves. To decrease the part of light absorbed by p-layer 153 ditch 160 is made in the lightened region of the p-layer. The depth of the ditch must not be more than the difference between the thicknesses of the p-layer and bulk charge layer appearing at the maximum reverse voltage. To reduce the structure overheating and to increase stability to the dv/dt effect, a p-type ring area with at least one discontinuity shown in FIG. 24 being a bottom view of the structure presented in FIG. 23, were used. Here 161 is an n-base, 162 is a p-emitter, 163 is a p-base, 164 is an n-emitter, 165 is an n-type area with photo current flowing through it. Under light acting, at first the structure region limited by area 165 is switched on. Then the switched-on state is spreading through the p-ring discontinuities and reaches n-area 164. After n-area 164 is switched on, load current practically does not flow through the central region of the structure limited by n-area 165.

In case when a reverse (changing the direction of directed current) controlled bridge three-phase rectifier is needed, thyristors of the unit (FIG. 14) have to be replaced to symistors (triacs). However in this case the problem of symmetry (leveling) of forward and reverse control currents remains.

Figure 25:
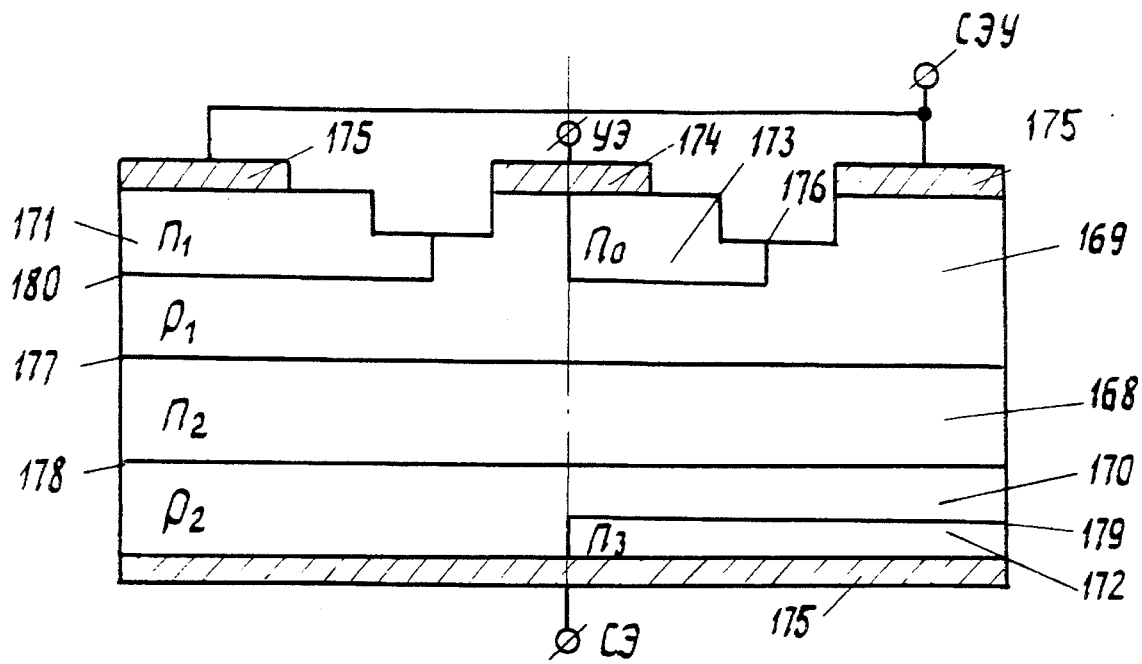
FIG. 25 is a view showing a fragment of the control area of a triac with the groove partly entering in the n-regions of the emitter and of the gate.
Figure 26:
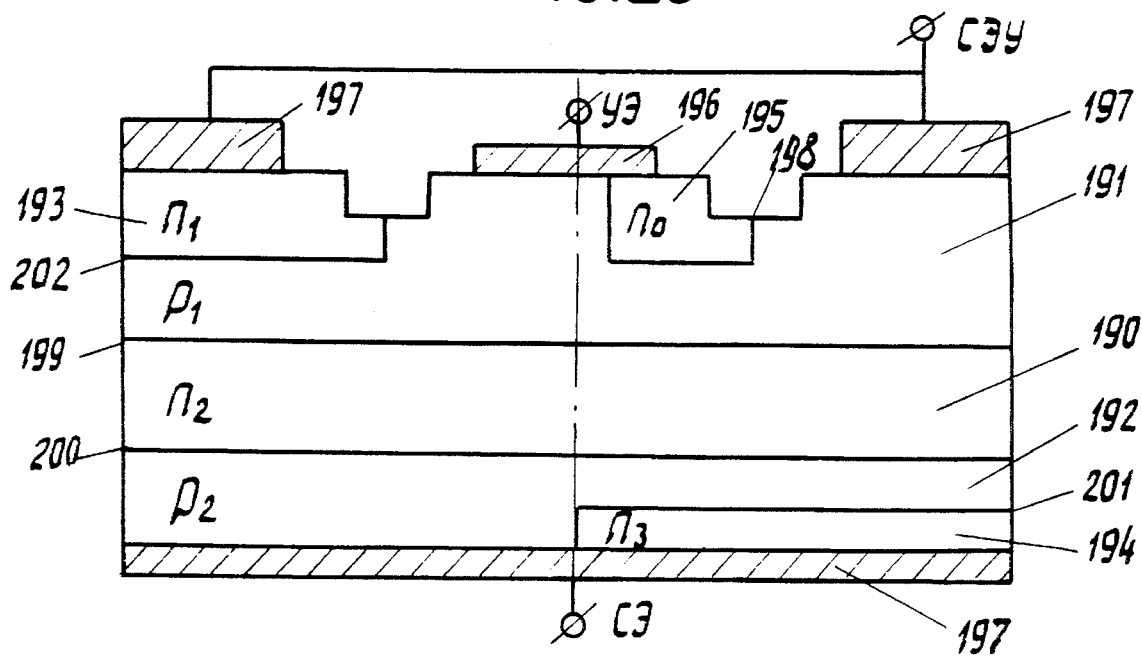
FIG. 26 is an illustration of the groove formed in the p-n junction regions between the main electrode metallization area and the gate.

In FIGS. 25 and 26 designs of the triac structures are presented, a feature of which is a reduced control current and higher symmetry. The structure in FIG. 25 includes n-base 168, p1 layer 169 as an emitter, p-base and control area, p2 layer 170 as an emitter and p-base, n-emitters 171 and 172, p2 layer 173 as a control area.. Layers of p and n-types form p-n junctions 176, 177, 178, 179, 180. From top and bottom sides metallization 175 is performed on the basic electrodes. On the control area there is metallization 174.

The structure in FIG. 26 includes n-base 190, p1 layer 191 as a base, emitter and control area, p2 layer 192 as an emitter and p-base, n-emitters 193 and 194, n-type control area 195. Layers of o and n-types form p-n junctions 198, 199, 200, 201, 202. From top and bottom sides metallization 197 is performed on the basic electrodes. On the control area there is a metallization 197. The structures in FIGS. 25 and 26 differ from the known structures of the triacs by the fact that the groove made between the control area and basic contact metallization on the upper plane either partly comes in the n1 are only (FIG. 25), or partly comes in n1 and p1 areas (FIG. 26). In this case, compared to the known structures of the triacs, current density on the edge of injecting junctions increases, and control currents decrease.

In cases, when a reverse controlled bridge rectifier with isolated input is required, it is sufficient to replace the photothyristor elements in the unit (FIG. 18) by photosymistor elements. However, the features of photothyristor use in the controlled bridge rectifiers make some requirements on photosymistor elements. This first of all is the requirement of little control power, high rate of current and voltage rise. The structures of photosymistors presented in FIGS. 27–35 meet these requirements.

Figure 27:
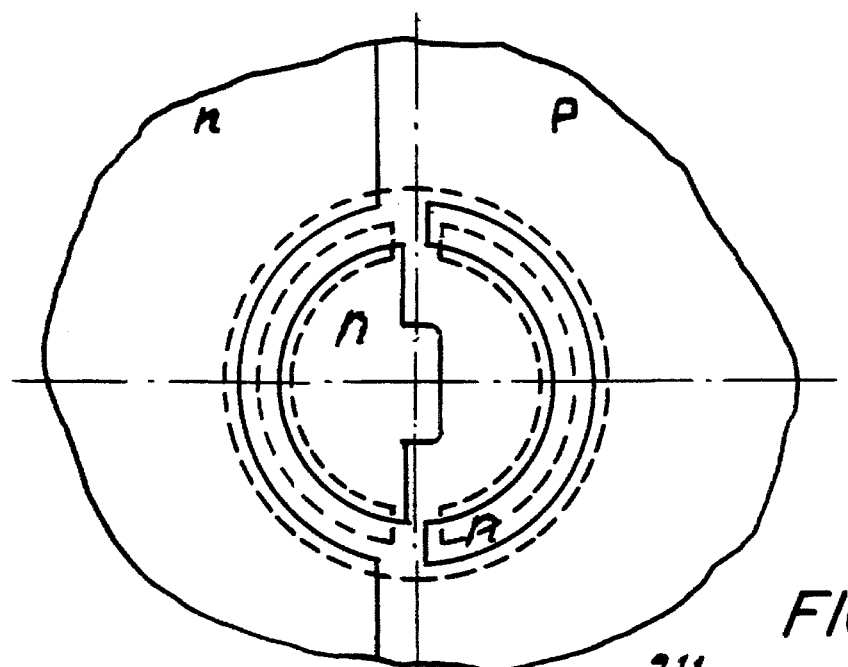
FIGS. 27 through 35 are top views, cross-sections, and bottom views of a fragment of the photosymistor control area with improved dynamic characteristics for three versions.
Figure 28:
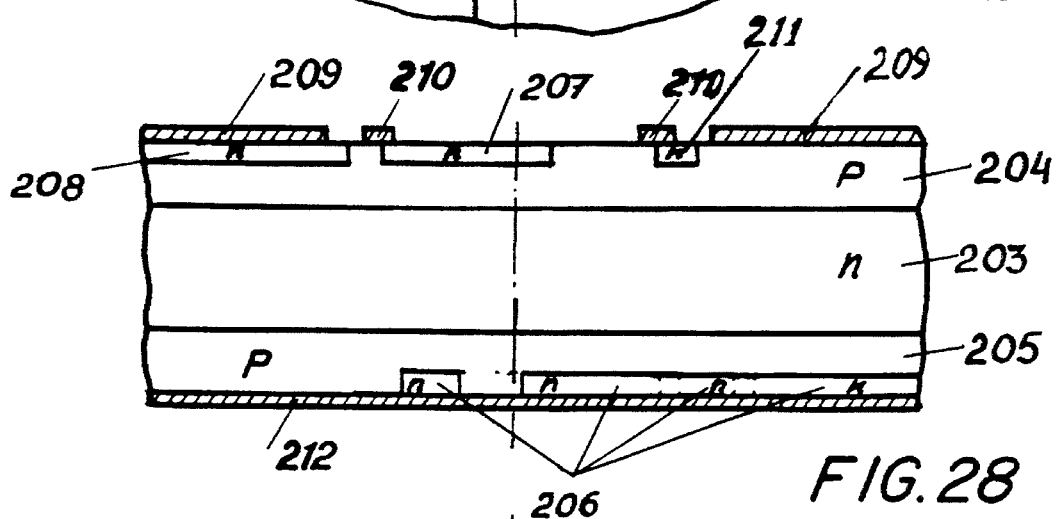
Figure 29:
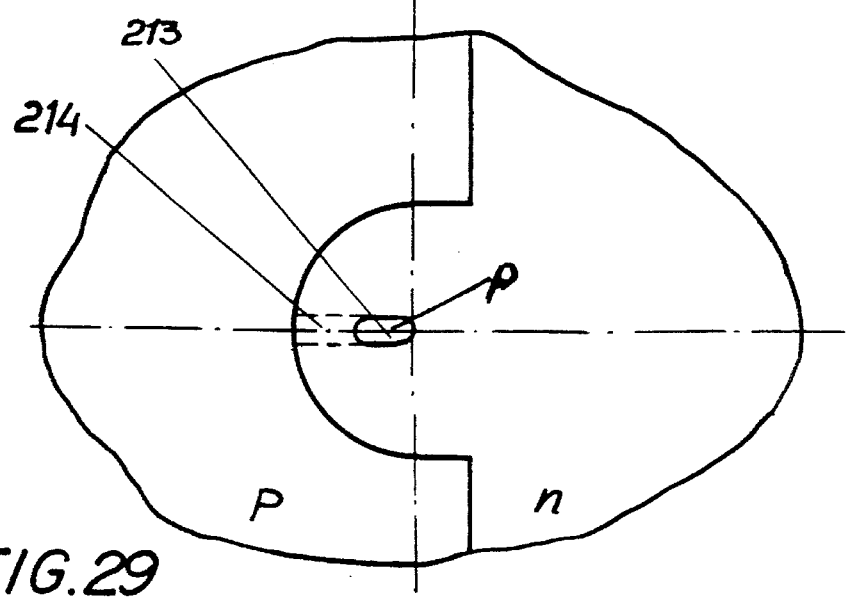

In FIGS. 27, 28 and 29 a top, cross-section and bottom view of a photosymistor structure are presented. In creating these structures measures were taken that in the initial switching-on area where both regions of forward-oriented and of reverse-oriented p-n-p-n structures. In the known photosymistor structures in the initial switching-on area five payer n-p-n-p-n structures are formed. The structure in FIG. 28 includes n-base 203, p-layers 204 and 205 as a base and an emitter. N-layers 206, 207, 208 and 211 function as an emitters. Metallization 209 and 210 act as contacts to the basic part and control area shown in FIG. 27 by dashed lines. The bottom surface of the structure is covered by metallization 212. On the lower plane in the n-type ledge p-type region 213 is created, which can be connected with p-emitter 205 by p-type photosymistors, the structure shown in FIGS. 227, 28, 29 differs by the fact that due to reducing extension of n-layer 207 and because of forming region 213 when forward and reverse switching on, in the area of the initial forward and reverse switching on, a p-n-p-n structure is formed. The switching on comes as follows. At first a region with the p-n-p-n structure is switched on, then this state is spreading to the basic part of the structure (forward polarity). At the revere polarity current flows from the n-type ledge in the lower plane 206 to the p-type area 204 at the right boundary of n-type area 207.

Figure 30:
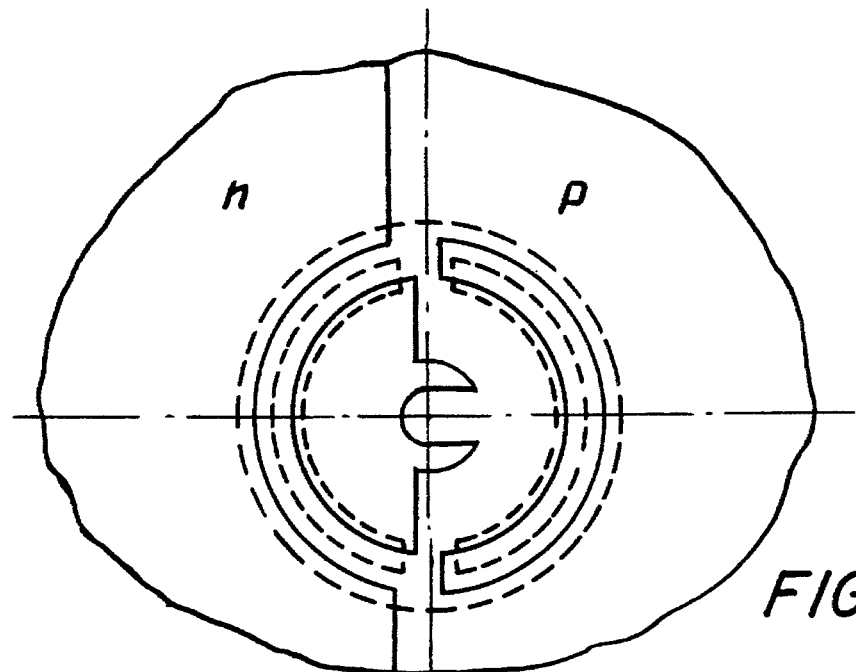
Figure 31:
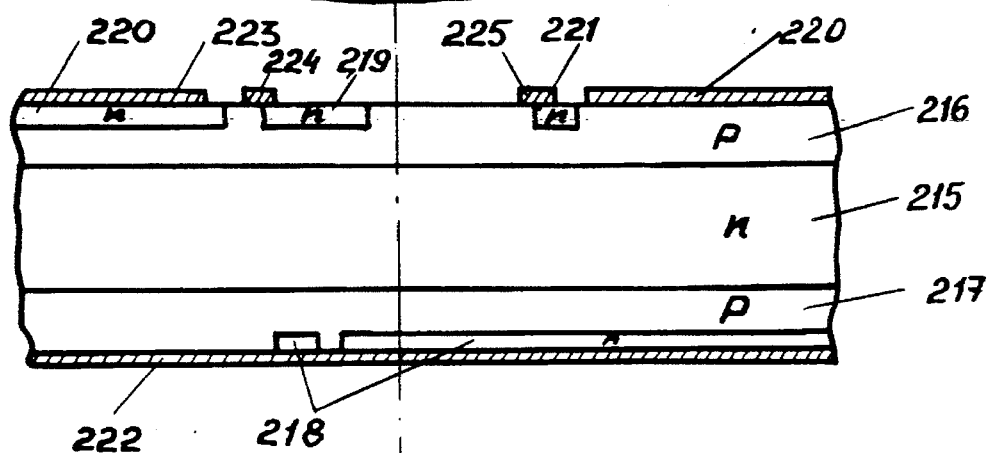
Figure 32:
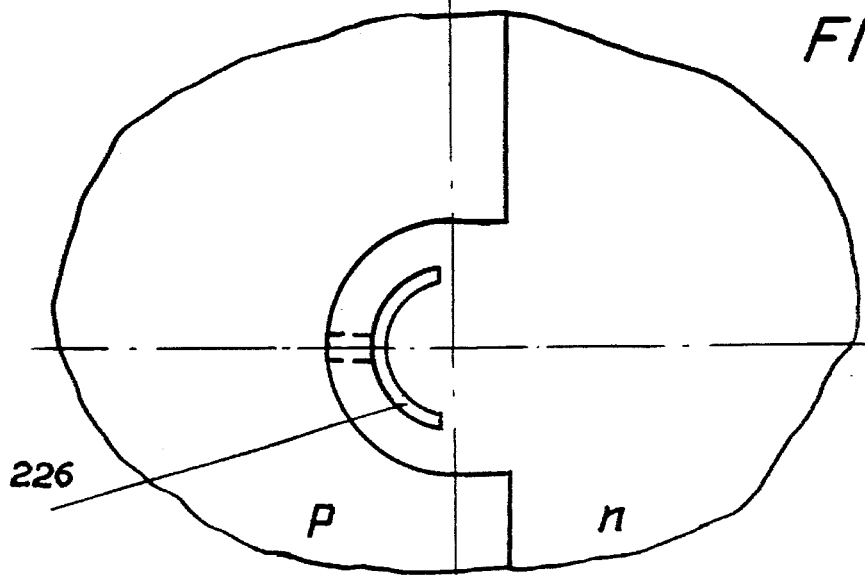

In FIGS. 30, 31 and 32 a top view, cross-section and bottom view of one more version of a photosymistor structure with improved dynamic characteristics are shown. The structure is formed based on the initial material of n-type (n-base) 215. It contains p-layers 216 and 217 as a base and an emitter, n-layers 218, 219, 220 and 221 as emitters, metallization 223,224, and 225 on the upper plane shown in FIG. 30 by dashed lines and metallization 222 on the lower plane. On the lower plane in n-type area 218 a p-type region as a part of ring 226 is made, which can be linked with p-type area 218 coming out to the lower plane, by means of a p-type channel shown in FIG. 30 by dashed lines. As compared with the previous version (FIGS. 27, 28, 29), the p-type on the upper plane is drawn nearer to the switching on area due to a p-type ditch on n-type ledge 219. The p-type region is transformed in ring part 226. These measures reduce the voltage drop on the p-n-p-n structure in the initial moment of the switching on and increase the probability of the initial switching on area to entry into p-type region 226 on the lower plane of the structure. The two last versions are the structures with a regenerative gate. Nevertheless, these technical decisions are applicable to non-regenerative structures as well. In this case the photo window is limited by the areas inside the half rings.

Figure 33:
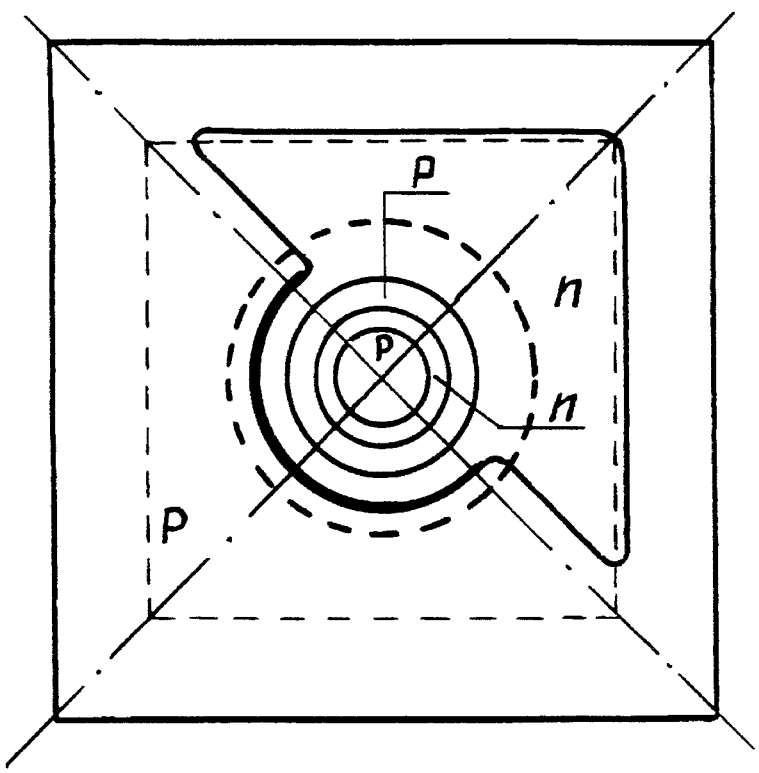
Figure 34:
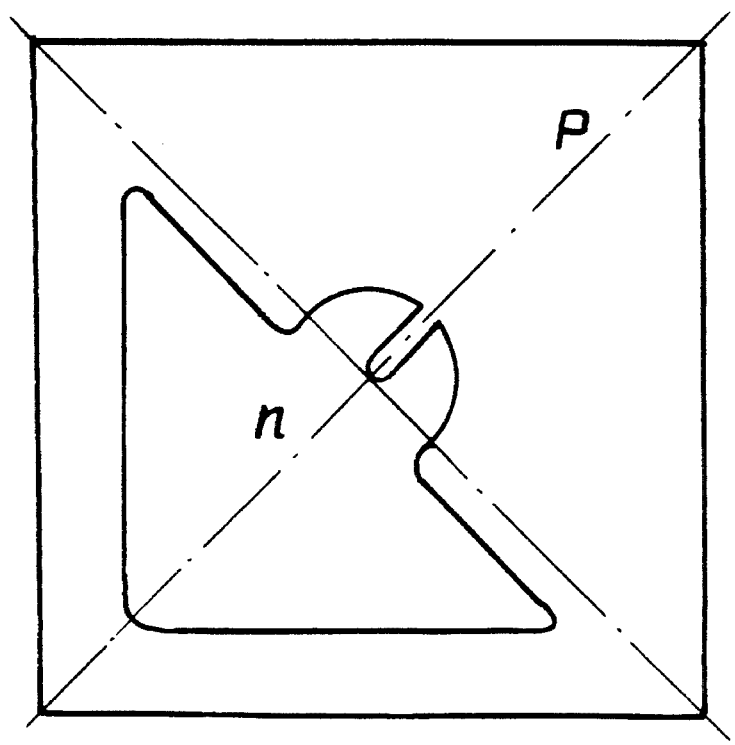
Figure 35:
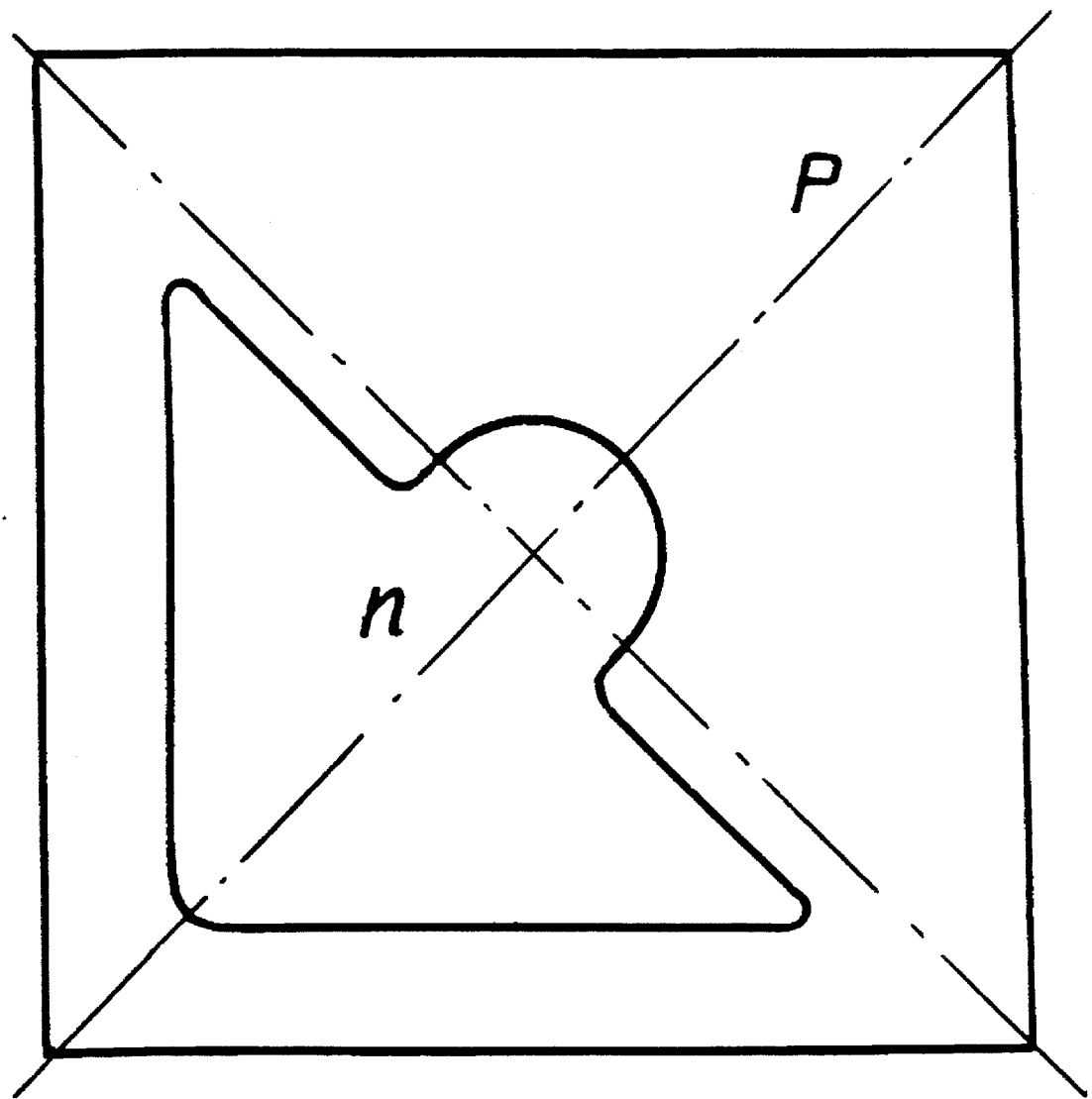

In FIGS. 33, 34, 35 the third version of an optosymistor with normal (non-regenerative) control system is presented. The geometry of the p and n-areas on the lower plane in FIG. 34 is similar to FIG. 29. The problem of the switching-on area drawing nearer to the regions with the four layer p-n-p-n structures is solved using different rings of n- and p-types in the control area (the photo window) in FIG. 33, where the photo window area is marked by a dashed round. The load current rise rate increase effect also takes place in case of the structure, top view of which is shown in FIG. 33, and the bottom view is in FIG. 35, that is without an additional region of p-type to be introduced in the ledge area of n-type on the structure lower plane.

A necessary element of the considered designs is a reserved by the profile groove with its bottom being in the initial n-type material, and the external part contacts with the side layer of p-type. In principle, the groove is a passive element, as the load current does not flow through it. In this connection the groove must have minimal dimensions performing its function: to rise the p-n junction breakdown voltage on the surface. To solve the task technical proposals shown in FIGS. 36–41 were done.

Figure 36:
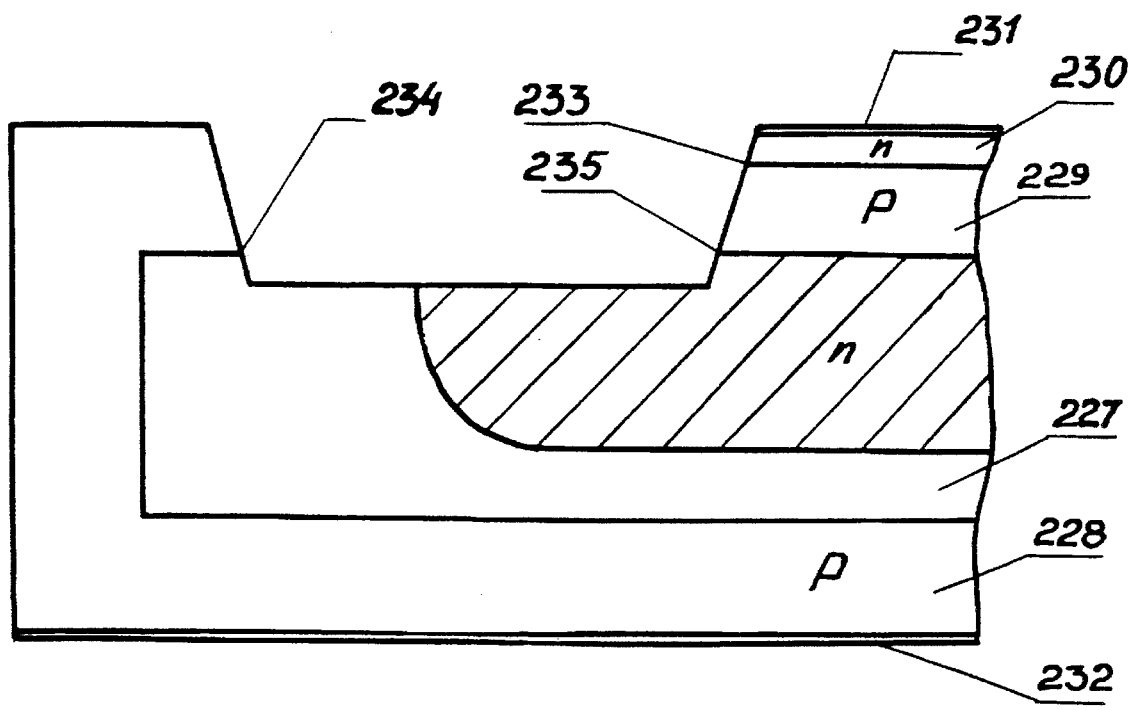
FIGS. 36 and 37 are views showing the thyristor bulk charge layer distribution at the forward and reverse voltage for a not deep groove.
Figure 37:
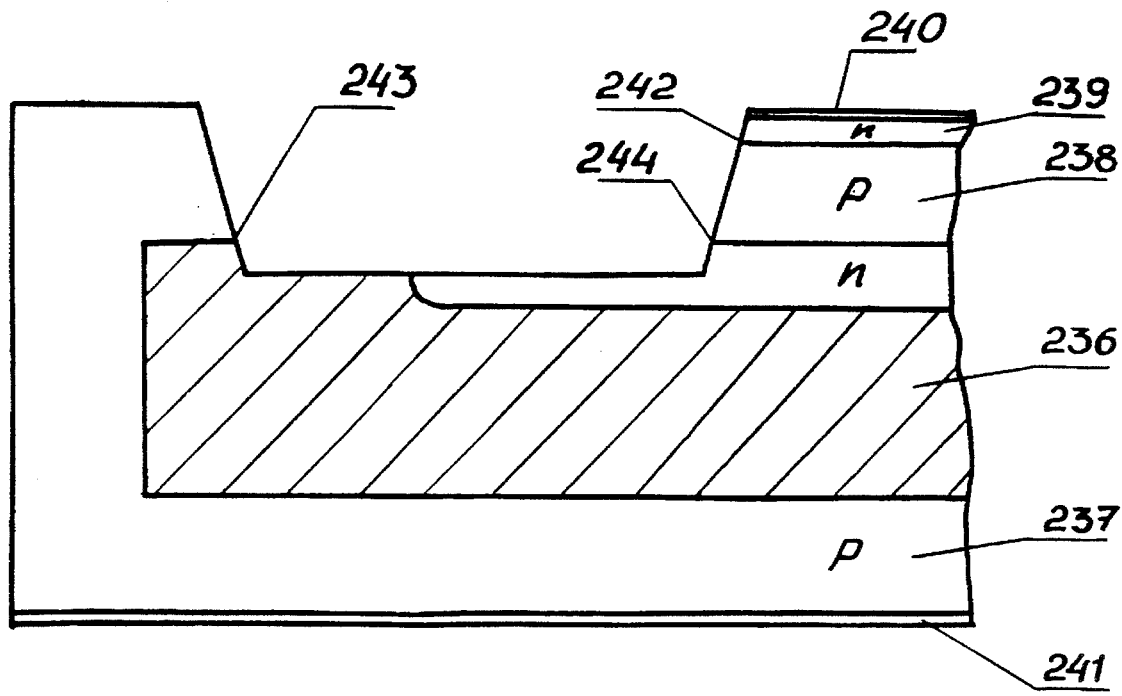

In FIG. 36 a cross-section of the p-n-p-n structure peripheral part made on the basis of an n-type initial semiconductor (the n-base 263) is presented. The structure also contains a p-layer 228 being an emitter and a side highly-doped layer, n-emitter 230. The layers form p-n junctions 233, 234 and 235. On the upper plane metallization 231, on the lower plane metallization 232 are deposited. A feature of the device in FIG. 36 is a not deep groove with its bottom located in n-base 237. Its depth h is equal to $x_j + x_{ck}$, where $x_j$ is the depth of p-n junction 235 occurrence, $x_{ck}$ is the extension of the compensated layer in the n-base. Under the forward switching the p-n-p-n structure (minus at upper contact 231 and plus at lower contact 232) the bulk charge layer (the dashed part of FIG. 36) joins the place of p-n junction 234 coming out to the surface. It can be avoided, if the distance between the place of the p-n junction 234 coming out to the surface and the bulk charge boundary on the bottom of the groove is more than the effective width of the n-base wnef. In FIG. 37 a structure with a not deep groove under the reverse voltage on the structure plus at the upper contact and minus at the lower contact) made based on semiconductor 236 of n-type is presented. The structure also includes p-base 238, p-layer 237 as an emitter and a side highly-doped layer, n-emitter 239, contacts to the semiconductor 240 and 241. The p- and n-layers form p-n junctions 242, 243, and 244. To avoid closing of the bulk charge at the maximum reverse voltage, it is necessary that similarly to the forward voltage case, the distance between the place of p-n junction 244 coming out to the surface and the bulk charge boundary on the bottom of the groove would be more than the effective width of the n-base $W_{nef}$. In FIGS. 36 and 27 the bulk charge is indicated by dashed lines.

Figure 38:
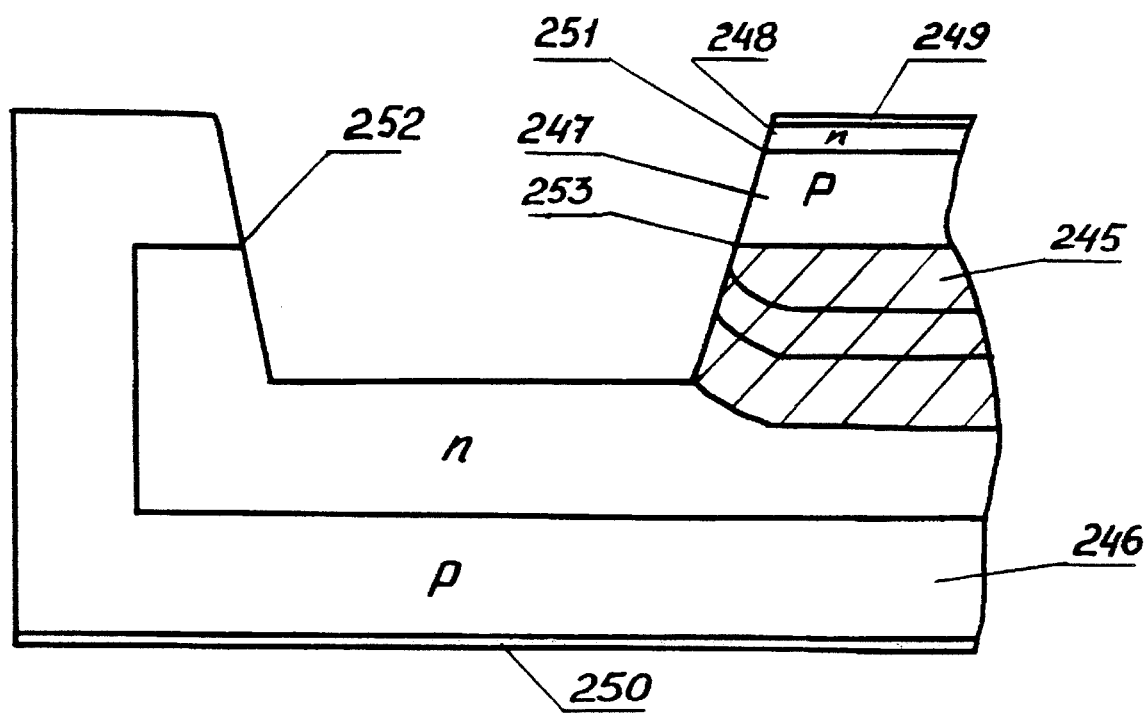
FIGS. 38 and 39 are the same views but for a deep groove.
Figure 39:
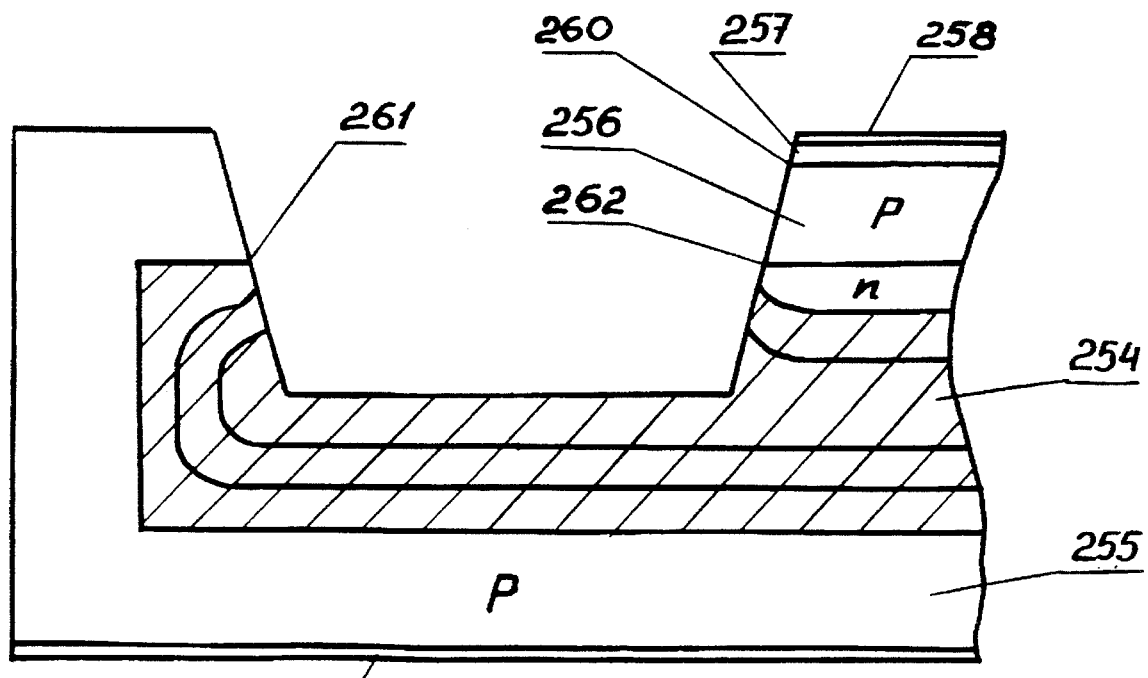

In FIGS. 38 and 39 the p-n-p-n structure is presented under the forward and reverse voltage at the contacts correspondingly in case of the deep groove, when the groove depth essentially exceeds the value of the $x_j + x_{ck}$. In FIGS. 38 and 39 correspondingly the following indications are taken: initial material of n-base: 227 and 236, p-base: 229 and 238, p-emitter: 228 and 237, n-emitter: 230 and 239, contacts: 231, 232, 240, 241, p-n junctions: 233, 234, 235, 242,263 and 244. Under the forward bias the boundary of the LO bulk charge on the groove surface is mostly located in the region of the groove abrupt part. In this version the maximum value of the groove depth is determined by the demand to provide operation of the structure in the reverse direction (FIG. 39), when the bulk charge layer must come out at a maximally possible surface of the groove. Such a version is presented in FIG. 39. When taking into account the requirements of the forward and reverse switching, the maximum depth of the groove must not exceed the value $x_j + 0.5 W_n$, where $W_n$ is the geometrical width of the n-base. Thus the depth of the groove is chosen from the term:

$$x_j + 0.5 w_n > h > x_j + x_{ck}$$

Figure 40:
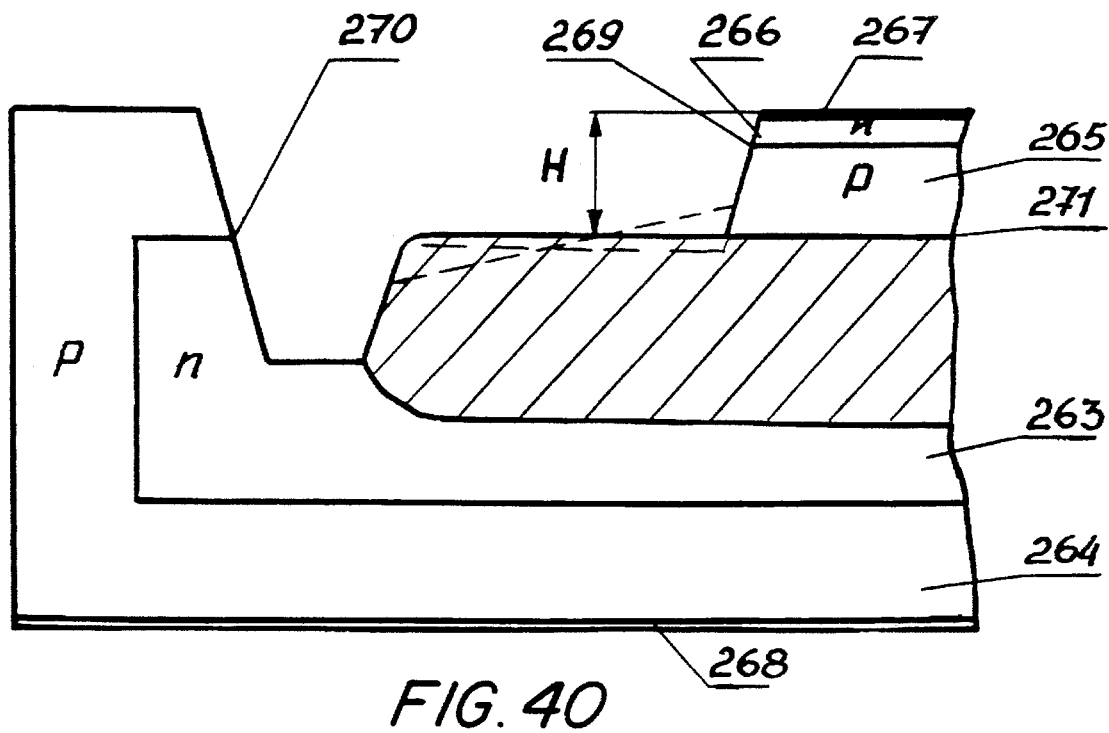
FIG. 40 is a view showing the bulk charge layer distribution in presence of a ledge in the groove at the forward voltage.
Figure 41:
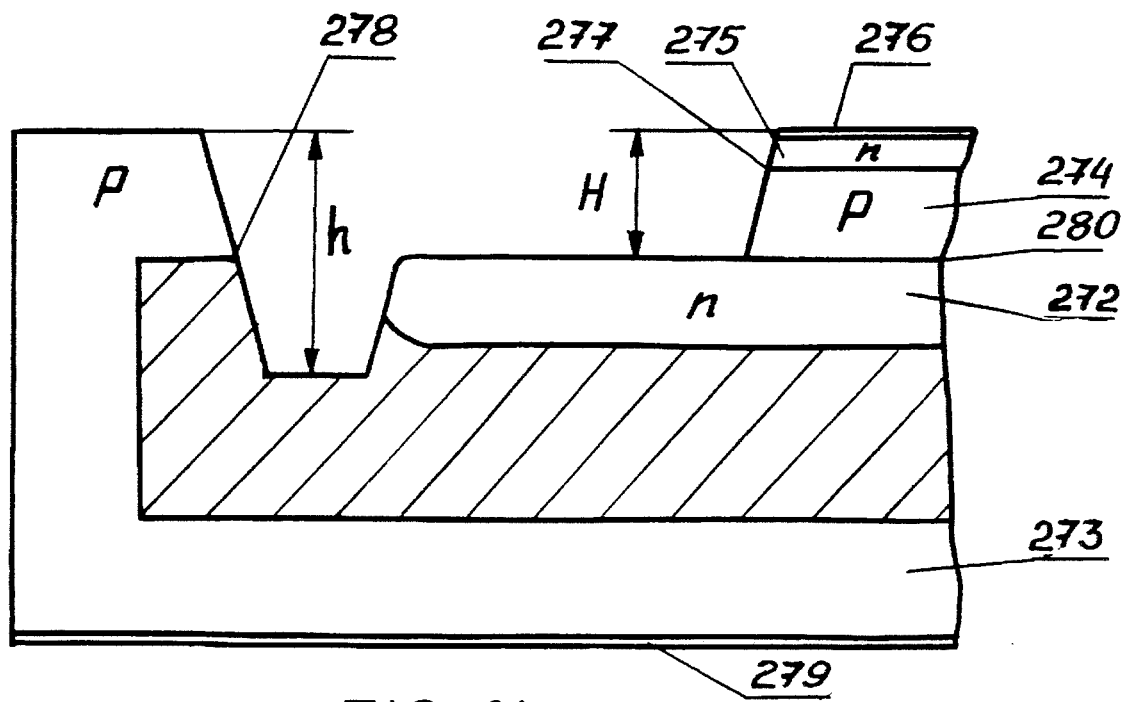
FIG. 41 is the same view but for the reverse voltage.

It must be noted that in practice there is no value of the groove depth providing the equal conditions for the forward and reverse switching. Considering that in practice a groove is formed by etching, in view of the dispersion a not deep groove has the depth 2–3 ($x_j + x_{ck}$). As to deep grooves, better conditions are provided under reverse switching. One more technical decision is possible, which allows a coincidence of advantages of deep and not deep grooves. In FIGS. 40 and 41 a design of a p-n-p-n structure with a step in the groove area is presented. Here the next indications are correspondingly made: initial material: n-base: 263 and 272, p-base: 265 and 274, p-emitter: 264 and 273, n-emitter: 266 and 276, p-n junctions: 269, 270, 271 and 277, 278, 280, contacts: 267, 268 and 276, 279. Presence of the step leads to the fact that the right part of the groove can be considered as a not deep groove providing high reverse voltages. The width of the step is no less than 1.5 $W_{bc}$ ($W_{bc}$ is the width of the bulk charge so as the surface strength of electric field in the average would not be more than the bulk one).

To minimize the technological dispersion the flat part of the step H can be made at a small angle (1°–20°). In FIG. 40 it is shown by a dashed line.

The width of the groove determines the length of the groove perimeter under the p-n junction line, which (the length) must not be less than the maximum width of the bulk charge. In view of the fact that the groove can have not only vertical but inclined walls, it is necessary that the width of the groove were at least half as much again the width of the bulk charge. The groove can be offset from the p-type side layer, as is shown in FIGS. 40 and 41, however minimal expenses of useful surface will be in case, when the external part of the groove is coincident with the boundary of the p-type side layer.

The module of a three-phase rectifying bridge chosen as an example does not limit possibilities of technical decision applications. These decisions embraced by the patent claims make it possible to realize products as follows:

1. Double-element modules
   - double-element diode and anti-parallel modules,
   - double-element thyristor anti-parallel modules,
   - double-element optothyristor anti-parallel modules,
   double-element one-directional diode modules,
   double-element one-directional thyristor modules,
   - double-element one-directional optothyristor modules,
   - double-element symistor modules,
   - double-element optosymistor modules.
2. Three-element modules
   - three-element one-directional diode modules with a common point,
   - three-element one-directional thyristor modules with common point,
   - three-element one-directional optothyristor modules with common point,
   - three-element symistor modules,
   - three-element optosymistor modules.
3. One-phase bridge rectifiers
   - one-phase diode bridge rectifiers,
   - one-phase thyristor bridge rectifiers,
   - one-phase optothyristor bridge rectifiers,
   - one-phase reverse symistor bridge rectifiers,
   - one-phase reverse optosymistor bridge rectifiers.
4. Half-controlled rectifiers
   diode-thyristor half-controlled modules,
   diode-thyristor half-controlled one-phase bridge rectifiers,
   diode-optothyristor half-controlled one-phase bridge rectifiers,
   - diode-thyristor half-controlled three-phase bridge rectifiers,
   - diode-optothyristor half-controlled three-phase bridge rectifiers with isolated input.
5. Multi-element modules and multi-phase rectifiers
   - multi-element diode modules and multi-phase rectifiers,
   - multi-element diode modules,
   - multi-element thyristor modules,
   - multi-element optothyristor modules,

- multi-element symistor modules,
- multi-element optosymistor modules,
- multi-phase diode bridge rectifiers,
- multi-phase thyristor bridge rectifiers,
- multi-phase optothyristor bridge rectifiers with isolated input,
- multi-phase reverse symistor bridge rectifiers,
- multi-phase reverse optosymistor bridge rectifiers,
- multi-phase diode-thyristor half-controlled bridge rectifiers,
- multi-phase diode-optothyristor half-controlled bridge rectifiers with isolated input.

Practically, the claimed technical decisions make it possible to solve the problem of creating almost all circuits of rectifiers and their parts including hybrid and integral versions based on diodes, thyristors, symistors, optothyristors and optosymistors. In additional to the said, elements of the modules can be used as discrete semiconductor devices or caseless components. As such devices can be used:

- forward-oriented diodes (diode element of the anode group, FIG. 3),
- reverse-oriented diodes (diode element of the cathode group, FIG. 2),
- reverse-oriented thyristors (thyristor element of the anode group, FIG. 10, FIG. 17),
- reverse-oriented photothyristors and optothyristors (FIGS. 21–24),
- thyristors and symistors with reduced control currents (FIGS. 25, 26),
- photothyristors and optothyristors with high rise rate of load current (FIGS. 27–35).

Design of the control area (FIGS. 25 and 26) is applicable to discrete thyristors and symistors. Similarly, the design of the grooves presented in FIGS. 36–41 can be used in discrete diodes, thyristors and symistors.

The proposed units can be manufactured using the generally accepted planar or hybrid technologies. In this case the side p-type layer is produced either by means of aluminum counter diffusion or aluminum thermal migration.

A device specific design depends on conditions of its following operation.

It will be understood that each of the elements described above, or two or more together, may also find a useful application in other types of constructions differing from the types described above.

While the invention has been illustrated and described as embodied in a semiconductor rectifying module, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A semiconductor rectifying module, comprising a metal base; a dielectric heat conducting spacer arranged on said metal base; two current leading out electrodes arranged on said spacer; and rectifying elements of anode and cathode groups arranged with their cathodes and anodes on said electrodes correspondingly, said rectifying elements being composed of a semiconductor with at least two layers having different conductivity types, one of said layer being composed of semiconductor material of a first type conductivity, each of said rectifying elements being surrounded by a side layer composed of semiconductive material of a first type conductivity, and being provided with an upper reserved separating groove between said side layer and a remaining part of said rectifying elements; at least two current leading in electrodes arranged on said rectifying elements at a side opposite to said base.

2. A semiconductor rectifying module as defined in claim, wherein said groove borders said side layer.

3. A semiconductor rectifying module as defined in claim 1, wherein said closed separating groove crosses an upper blocking p-n junction.

4. A semiconductor rectifying module as defined in claim 1, wherein each of said rectifying elements is formed a diode.

5. A semiconductor rectifying module as defined in claim 1, wherein each of said rectifying elements is formed as a thyristor.

6. A semiconductor rectifying module as defined in claim 5, wherein said thyristor is formed as an anode group thyristor controlled from an anode side.

7. A semiconductor rectifying module as defined in claim 5, wherein said thyristor is a photothyristor.

8. A semiconductor rectifying module as defined in claim 7; and further comprising a light source installed over each of said photothyristors.

9. A semiconductor rectifying module as defined in claim 8, wherein said light source is a light emitting diode.

10. A semiconductor rectifying module as defined in claim 1, wherein each of said rectifying element is formed as a symistor.

11. A semiconductor rectifying module as defined in claim 1, wherein each of said rectifying elements is formed as photosymistor bidirectional thyristor controlled by light from one surface.

12. A semiconductor rectifying module as defined in claim 11; and further comprising a light source installed over each of said photosymistors.

13. A semiconductor rectifying module as defined in claim 12, wherein said light source is formed as a light emitting diode.

14. A semiconductor rectifying module as defined in claim 1, wherein said cathode and anode groups of said rectifying elements are isolated by an air gap.

15. A semiconductor rectifying module as defined in claim 1, wherein said cathode and anode groups of said rectifying elements are isolated by an organosilicon compound.

16. A semiconductor rectifying module as defined in claim 1, wherein said cathode and anode groups of said rectifying elements are arranged in a single crystal with a common side layer of a p-type, said crystal being formed with two longitudinal lower grooves having external parts located on a boundary of a common side layer of the p-type and an original material of an n-type.

17. A semiconductor rectifying module as defined in claim 1, wherein said cathode and anode groups of said rectifying elements are arranged in a single crystal with a common side layer of a p-type formed with a central isolating layer of an n-type, said crystal being provided with two longitudinal lower grooves with bottoms located in said central isolating layer of the n-type.

18. A semiconductor rectifying module as defined in claim 1, wherein said anode group has thyristors forming said rectifying elements and provided with a gate located at a separate area.

19. A semiconductor rectifying module as defined in claim 6, wherein said thyristor controlled from said anode side is formed as a multilayer structure with different layers of the first and second conductivity types with an anode combined with a gate region located on a p-emitter region, an n-type ring region with a gate is formed within an anode control area, an n-emitter region with a cathode is located in a p-base region, an n-emitter region having a round n-type area located so that a control area projection is completely located on said round area, a ring area of an n-type, and a p-base ring area located therebetween.

20. A semiconductor rectifying module as defined in claim 19, wherein said ring emitter area of the n-type is formed with spacings directed radially relative to a symmetry axis of said ring emitter area.

21. A semiconductor rectifying module as defined in claim 20, wherein a distance of said ring elements between said spacings is equal to $0.1$–$10\ V_p$ wherein $V_p$ is a width of said p-base.

22. A semiconductor rectifying module as defined in claim 7, wherein said anode group includes a photothyristor mounted with its cathode on a metal plate and controlled from an anode side, which contains a photo window and is located on a p-emitter region.

23. A semiconductor rectifying module as defined in claim 22, wherein a window zone of said p-emitter region has at least one reserved area each containing at least one spacing located radially relative to a symmetry axis of said window zone.

24. A semiconductor rectifying module as defined in claim 23, wherein said reserved area is formed as an n-type conductivity area.

25. A semiconductor rectifying module as defined in claim 23, wherein said reserved area is formed as a groove.

26. A semiconductor rectifying module as defined in claim 23, wherein said reserved area has a depth which does not exceed a difference of a thickness of the p-emitter region and a depth of a bulk charge area in said p-emitter region at a maximum reverse voltage.

27. A semiconductor rectifying module as defined in claim 23, wherein said n-emitter region is provided under said photo window zone with a ring p-region with spacings directed radially relative to a symmetry axis of said ring area.

28. A semiconductor rectifying module as defined in claim 10; and further comprising a control area involving p- and n-type regions and at least one groove located between said gate and main contacts, said groove being in an area of at least one conductivity type without metallization.

29. A semiconductor rectifying module as defined in claim 28, wherein said area without metallization is at least one electron type area.

30. A semiconductor rectifying module as defined in claim 28, wherein said at least one area without metallization includes at least one electron-type region and one hole type region.

31. A semiconductor rectifying module as defined in claim 28, wherein said groove has a depth between 0.1 and 0.5 of a depth of said emitter p-n junction which is first from said control area.

32. A semiconductor rectifying module as defined in claim 28, wherein said groove has a width which exceeds a width of an end emitter junction bulk charge layer at a maximum reversible voltage of a gate, said groove having a part corresponding to an electron type region and to a hole type which part exceeds a width of a bulk charge layer at said voltage.

33. A semiconductor rectifying module as defined in claim 11, wherein said photosymistor is a multilayer semiconductor structure with different regions of conductivity types shunted by end p-n junctions and overlapping n-type layer projections to a main phase of a structure, and having a p-type region arranged in an n-type region positioned at a lower plane under a photo window between a symmetry axis and an electron type ridge boundary on the lower plane.

34. A semiconductor rectifying module as defined in claim 33, wherein said p-type region is formed as one of a round, an oval and a part of a ring with a symmetry axis coincident with the symmetry axis of a control area.

35. A semiconductor rectifying module as defined in claim 33, wherein said electron-type ridge On an upper plane in said photo window zone has a groove with a symmetry axis coincident with a symmetry axis of a control area, said groove having a most removed point between said axis of symmetry of said control area and said photo window boundary.

36. A semiconductor rectifying module as defined in claim 33; and further comprising hole type channel located between said hole type region of said lower plane and a hole type region under main contacts and connecting said regions with one another.

37. A semiconductor rectifying module as defined in claim 33; and further comprising hole type and ring regions formed in said upper plane electron-type and having an axis of symmetry coincident with an axis of symmetry of a control area.

38. A semiconductor rectifying module as defined in claim 1, wherein said groove has a width on a surface which does not exceed $1.5\ w_n$ and a depth located within $x_j+\Delta x_{ck}$ and $x_j+0.5\ W_n$, wherein $W_n$ is an n-base region depth, $x_j$ is a depth of a p-n junction formed by base regions, and $\Delta x_{ck}$ is a length of a compensated layer in the n-base region.

39. A semiconductor rectifying module as defined in claim 38, wherein an inner ledge of said groove has a step with a width not less than $1.5\ W_{bc}$ and a depth not less than $x_j+\Delta x_{ck}$, wherein $W_{bc}$ is a bulk charge area with in the n-base region at a maximum voltage.

40. A semiconductor rectifying module as defined in claim 39, wherein said step is arranged at an angle of 1–20% relative to the p-n junction formed by the base regions and crosses said junction.

* * * * *